United States Patent
Itamoto et al.

(10) Patent No.: US 12,429,637 B2
(45) Date of Patent: Sep. 30, 2025

(54) NEAR-INFRARED-ABSORBING COMPOSITION, NEAR-INFRARED-ABSORBING FILM, AND IMAGE SENSOR FOR SOLID-STATE IMAGING ELEMENT

(71) Applicant: Konica Minolta, Inc., Tokyo (JP)

(72) Inventors: Natsumi Itamoto, Hino (JP); Yosuke Mizutani, Mitaka (JP); Koji Daifuku, Hino (JP); Kenji Hayashi, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 1044 days.

(21) Appl. No.: 17/441,807

(22) PCT Filed: Mar. 6, 2020

(86) PCT No.: PCT/JP2020/009643
§ 371 (c)(1),
(2) Date: Sep. 22, 2021

(87) PCT Pub. No.: WO2020/195701
PCT Pub. Date: Oct. 1, 2020

(65) Prior Publication Data
US 2022/0171107 A1 Jun. 2, 2022

(30) Foreign Application Priority Data
Mar. 26, 2019 (JP) ................. 2019-057694

(51) Int. Cl.
*G02B 5/20* (2006.01)
*C07F 9/09* (2006.01)
*G02B 5/22* (2006.01)
*H10F 39/00* (2025.01)

(52) U.S. Cl.
CPC .............. *G02B 5/208* (2013.01); *C07F 9/093* (2013.01); *G02B 5/223* (2013.01); *H10F 39/805* (2025.01)

(58) Field of Classification Search
CPC .......... G02B 5/208; G02B 5/223; G02B 5/22; C07F 9/093; H10F 39/805; H10F 39/12; C09K 3/00
See application file for complete search history.

(56) References Cited

FOREIGN PATENT DOCUMENTS

JP        4500417 B2      7/2010
JP        5554048 B2 *    7/2014
(Continued)

OTHER PUBLICATIONS

PCT, Written Opinion of ISA for the corresponding application No. PCT/JP2020/009643, dated Apr. 14, 2020, with English translation.
PCT, International Search Report for the corresponding application No. PCT/JP2020/009643, dated Apr. 14, 2020, with English translation.
Office Action for the corresponding Chinese Application No. 202080023431.3, dated Apr. 24, 2023, with English translation.
Office Action dated Sep. 19, 2023, for the corresponding Korean Application No. 10-2021-7029995, with English translation.
(Continued)

*Primary Examiner* — Deborah D Carr
(74) *Attorney, Agent, or Firm* — LUCAS & MERCANTI, LLP

(57) ABSTRACT

Provided is a near-infrared absorbing composition comprising a near-infrared absorber and a solvent, wherein the near-infrared absorber contains at least one of the following component (A) or component (B), Component (A): a component composed of a phosphonic acid compound represented by the following Formula (I), two or more kinds of phosphoric acid ester compounds or sulfonic acid ester compounds having different structures, and copper ions; and Component (B): a component composed of a copper complex obtained by a reaction of a phosphonic acid compound represented by the following Formula (I), two or more kinds of phosphoric acid ester compounds or sulfonic acid ester compounds having different structures, and a copper compound, (Continued)

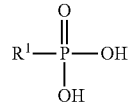

Formula (I)

in Formula (I), R¹ represents a hydrogen atom, an alkyl group having 1 to 20 carbon atoms, or a fluorinated alkyl group having 1 to 20 carbon atoms.

11 Claims, 1 Drawing Sheet

(56) References Cited

FOREIGN PATENT DOCUMENTS

| | | | | |
|---|---|---|---|---|
| JP | 5611631 B2 | 10/2014 | | |
| JP | 2019-081896 A | 5/2019 | | |
| KR | 2015-0097761 A | 8/2015 | | |
| KR | 2018-0059494 A | 6/2018 | | |
| WO | WO-2017051512 A1 * | 3/2017 | ............. | C08K 5/521 |
| WO | WO-2018088561 A1 * | 5/2018 | ................ | C07F 9/02 |

OTHER PUBLICATIONS

Office Action dated Oct. 3, 2023, for the corresponding Japanese Application No. 2021-508936, with English translation.

* cited by examiner

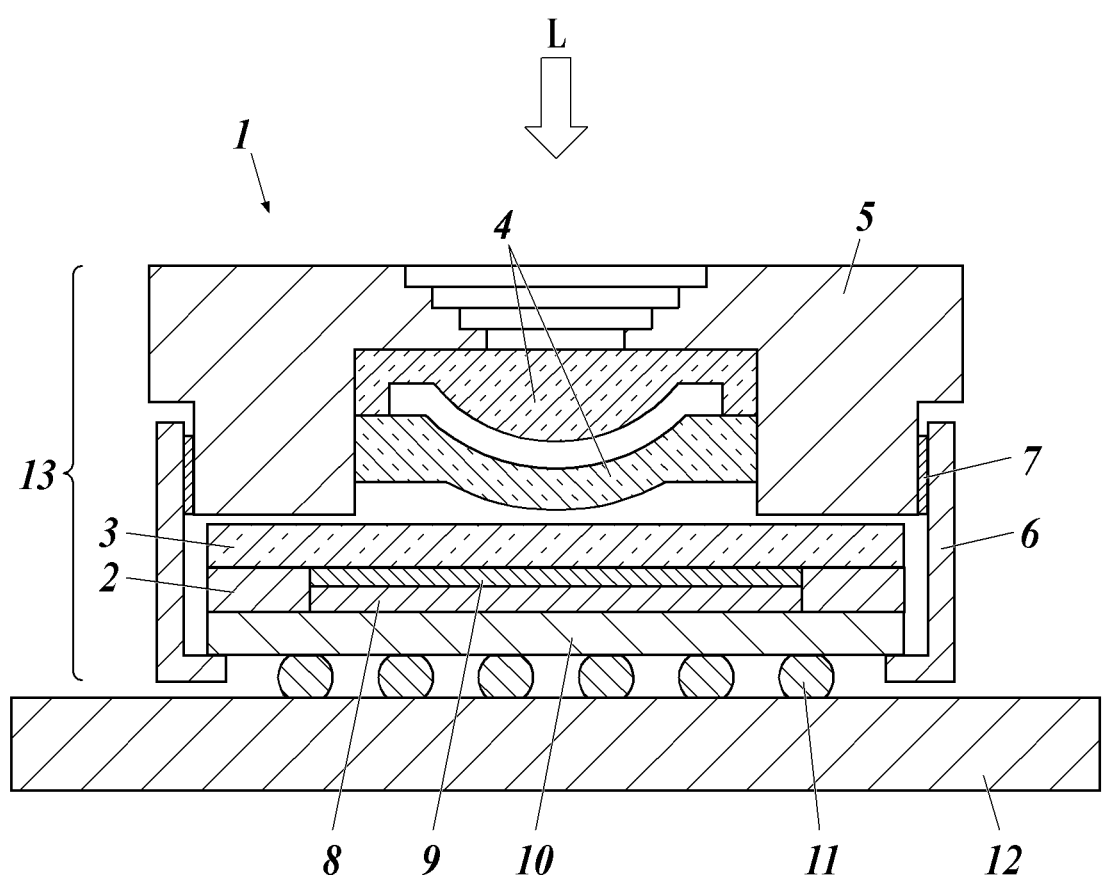

NEAR-INFRARED-ABSORBING COMPOSITION, NEAR-INFRARED-ABSORBING FILM, AND IMAGE SENSOR FOR SOLID-STATE IMAGING ELEMENT

CROSS REFERENCE TO RELATED APPLICATION

This Application is a 371 of PCT/JP2020/009643 filed on Mar. 6, 2020, which claims priority of Japanese patent application no. 2019-057694 filed on Mar. 26, 2019, the above applications are incorporated herein by reference.

TECHNICAL FIELD

The present invention relates to a near-infrared absorbing composition, a near-infrared absorbing film and an image sensor for a solid-state imaging element using the same. More specifically, the present invention relates to a near-infrared absorbing composition having excellent dispersing, transparency in the visible region, and light absorption of near-infrared light, a near-infrared absorbing film capable of reducing the film thickness, and an image sensor for a solid-state imaging element provided with the near-infrared absorbing film.

BACKGROUND

In recent years, CCD and CMOS image sensors, which are solid-state imaging elements for color images, have been used in video cameras, digital still cameras, and mobile phones with camera functions. These solid-state imaging elements use a silicon photodiode having sensitivity to light in the near-infrared wavelength region in the light receiving part, therefore it is necessary to perform luminosity correction. For that reason, a near-infrared cut filter (hereinafter, it may be called as an "IR cut filter") is often used.

As a material for forming such a near-infrared cut filter, various near-infrared absorbing compositions composed of a phosphoric acid ester, phosphonic acid, and copper ions, and an infrared cut filter using the same are disclosed.

For example, Patent Document 1 discloses an optical material composed of: at least one selected from a phosphonic acid monoester compound, a phosphinic acid compound, a phosphoric acid diester compound and a phosphoric acid monoester compound; a phosphonic acid compound; and metal ions. It is said that an optical material having improved spectral characteristics and compatibility with a resin can be obtained.

Further, Patent Document 2 discloses an infrared absorbing layer composition which is composed of copper ions, phosphonic acid, at least one of phosphoric acid diester or phosphoric acid monoester, and the content of phosphonic acid is defined to be less than 2.5 times the content of the phosphoric acid ester compound on a molar basis. According to the document, it is said that the optical characteristics in the infrared region and the visible region, which are desirable as a cut filter, can be obtained.

Further, Patent Document 3 discloses a near-infrared absorber composed of a phosphonic acid compound, a phosphoric acid ester compound, and a copper salt. It is said that a near-infrared cut filter suitably absorbing near-infrared light and having excellent transparency can be obtained.

Further, Patent Document 4 discloses a near-infrared absorber composed of a phosphonic acid compound, a monopolyoxyethylene alkyl phosphate compound, and copper ions. It is said that an optical material excellent in transparency and heat resistance can be obtained.

As the near-infrared cut filter, it is useful to use a thin-film color filter from the viewpoint of increasing the visible light transmittance and improving the handling property (not bulky). The near-infrared absorption is mainly exhibited by the copper complex, and in order to impart sufficient near-infrared absorption to the color filter when the film is thinned as described above, it is necessary to improve the absorption characteristics in the near-infrared region of the copper complex.

However, the methods disclosed in Patent Documents 1 to 4 are related to near-infrared absorbing compositions composed mainly of a phosphonic acid compound, almost one type of phosphoric acid ester compound, and copper ions. Absorption characteristics in the near-infrared region are insufficient. In order to exhibit sufficient absorption characteristics, it is necessary to add a large amount of near-infrared absorbing material, and as a result, the film thickness of the near-infrared absorbing film formed becomes considerably thick. Therefore, it is a major obstacle to the demand for visible light transmission and thin film formation.

PRIOR ART DOCUMENTS

Patent Documents

Patent Document 1: Japanese Patent No. 4500417
Patent Document 2: WO 2017/051512
Patent Document 3: Japanese Patent No. 5611631
Patent Document 4: Japanese Patent No. 5554048

SUMMARY OF THE INVENTION

Problems to be Solved by the Invention

The present invention has been made in view of the above problems and situations, and the problems to be solved are related to a near-infrared absorbing composition having excellent dispersion stability, visible light transmission and near-infrared light absorption, a near-infrared absorbing film capable of reducing the film thickness and an image sensor for a solid-state imaging element provided with the near-infrared absorbing film.

Means to Solve the Problems

As a result of examining the causes of the above problems in order to solve the above problems, the present inventor has achieved the following invention. The invention is a near-infrared absorbing composition containing a near-infrared absorber and a solvent, wherein the near-infrared absorber contains two or more kinds of phosphoric acid ester compounds or sulfonic acid ester compounds having different structures together with a phosphonic acid compound. By making at least one of the ester compounds to be a low molecular weight compound, it is possible to improve the dispersibility and to enhance the absorption of near-infrared light. Thereby, it is possible to realize a near-infrared absorbing composition having excellent visible light transmission and near-infrared light absorbing property, a near-infrared absorbing film capable of reducing the film thickness, and an image sensor for a solid-state imaging element provided with the near-infrared absorbing film.

In other words, the above problem according to the present invention is solved by the following means.

1. A near-infrared absorbing composition comprising a near-infrared absorber and a solvent, wherein the near-infrared absorber contains at least one of the following component (A) or component (B).

Component (A): a component composed of a phosphonic acid compound represented by the following Formula (I), two or more kinds of phosphoric acid ester compounds or sulfonic acid ester compounds having different structures, and copper ions.

Component (B): a component composed of a copper complex obtained by a reaction of a phosphonic acid compound represented by the following Formula (I), two or more kinds of phosphoric acid ester compounds or sulfonic acid ester compounds having different structures, and a copper compound.

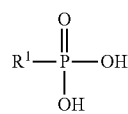

Formula (I)

In Formula (I), $R^1$ represents a hydrogen atom, an alkyl group having 1 to 20 carbon atoms, or a fluorinated alkyl group having 1 to 20 carbon atoms.

2. The near-infrared absorbing composition described in item 1, wherein the two or more kinds of phosphoric acid ester compounds or sulfonic acid ester compounds having different structures in the component (A) and the component (B) contain a compound A and a compound B, wherein the compound A has a structure represented by the following Formula (II), and is selected from the phosphoric acid ester compound or the sulfonic acid ester compound in which l and m each are respectively 0 or more, and the total number of l and m (l+m) is 1 or more and less than 4, and the compound B has a structure represented by the following Formula (II), and is selected from the phosphoric acid ester compound or the sulfonic acid ester compound in which l and m each are respectively 0 or more, and the total number of l and m (l+m) is in the range of 4 to 10.

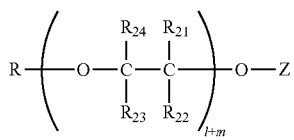

Formula (II)

In the above Formula (II), R represents an alkyl group having 1 to 20 carbon atoms or an aryl group having 6 to 20 carbon atoms, R may further have a substituent, and Z represents a structural unit selected from Formulas (Z-1) to (Z-3) below,

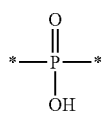

(Z-1)

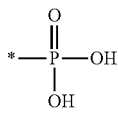

(Z-2)

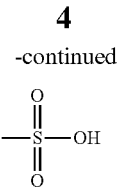

(Z-3)

an asterisk (*) described in the above Formulas (Z-1) to (Z-3) represents a binding site and binds O in the above Formula (II).

$R_{21}$ to $R_{24}$ each respectively represent a hydrogen atom or an alkyl group having 1 to 4 carbon atoms, provided that the compound having a structure represented by Formula (II) has at least one partial structure satisfying the following condition (i) or one partial structure satisfying the condition (ii), or has at least both of one partial structure satisfying the following condition (i) and one partial structure satisfying the condition (ii).

Condition (i): $R_{21}$ to $R_{24}$ all represent a hydrogen atom,
Condition (ii): at least one of $R_{21}$ to $R_{24}$ represents an alkyl group having 1 to 4 carbon atoms.

In Formula (II), l represents a number of partial structures satisfying the above condition (i), m represents a number of partial structures satisfying the above condition (ii), l and m in the compound A each are respectively 0 or more, the total number of l and m (l+m) is 1 or more and less than 4, l and m in the compound B each are respectively 0 or more, and the total number of l and m (l+m) is in the range of 4 to 10.

3. The near-infrared absorbing composition described in item 1 or 2, wherein a content of the phosphonic acid is 2.5 times or more on a molar basis with respect to the total content of the phosphoric acid ester compound or the sulfonic acid ester compound.

4. The near-infrared absorbing composition described in item 2 or 3, wherein a ratio of the compound A to the total mass of the phosphoric acid ester compound and the sulfonic acid ester compound is 50% by mass or more.

5. The near-infrared absorbing composition described in item 1 or 3, wherein the two or more kinds of phosphoric acid ester compounds or sulfonic acid ester compounds having different structures in the component (A) and the component (B) are at least two compounds selected from the phosphoric acid ester compounds or the sulfonic acid ester compounds having a structure represented by the following Formula (II).

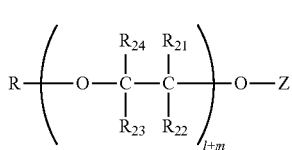

Formula (II)

In the above Formula (II), R represents an alkyl group having 1 to 20 carbon atoms or an aryl group having 6 to 20 carbon atoms, R may further have a substituent, and Z represents a structural unit selected from Formulas (Z-1) to (Z-3) below,

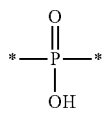

(Z-1)

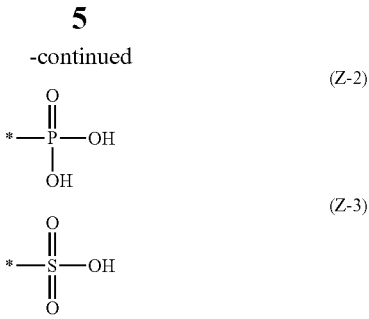

an asterisk (*) described in the above Formulas (Z-1) to (Z-3) represents a binding site and binds O in the above Formula (II), $R_{21}$ to $R_{24}$ each respectively represent a hydrogen atom or an alkyl group having 1 to 4 carbon atoms, provided that the compound having a structure represented by Formula (II) has at least one partial structure satisfying the following condition (i) or one partial structure satisfying the condition (ii), or has at least both of one partial structure satisfying the following condition (i) and one partial structure satisfying the condition (ii), Condition (i): $R_{21}$ to $R_{24}$ all represent a hydrogen atom,
Condition (ii): at least one of $R_{21}$ to $R_{24}$ represents an alkyl group having 1 to 4 carbon atoms.

In Formula (II), I represents a number of partial structures satisfying the above condition (i), m represents a number of partial structures satisfying the above condition (ii), and l and m each are respectively a number of 0 or more, and the total number of l and m (l+m) is 1 or more and less than 4.

6. The near-infrared absorbing composition described in any one of items 1 to 5, wherein in at least one compound among the two or more compounds having a structure represented by Formula (II), l and m each are respectively 1 or more.

7. The near-infrared absorbing composition described in any one of items 1 to 6, having a mass absorbance of 0.30 L/(g·cm) or more.

8. The near-infrared absorbing composition described in any one of items 1 to 7, wherein an average particle size of the near-infrared absorber is 100 nm or less.

9. The near-infrared absorbing composition described in any one of items 1 to 8, containing an near-infrared absorption modifier having an absorption maximum wavelength in the wavelength range of 650 to 1000 nm.

10. A near-infrared absorbing film using the near-infrared absorbing composition described in any one of items 1 to 9.

11. An image sensor for a solid-state imaging element provided with the near-infrared absorbing film described in item 10.

Effects of the Invention

According to the above means of the present invention, it is possible to provide a near-infrared absorbing composition having excellent dispersion stability, visible light transmission and near-infrared light absorption, a near-infrared absorbing film capable of reducing the film thickness, and an image sensor for a solid-state imaging element provided with the near-infrared absorbing film.

The expression mechanism and action mechanism of the effect of the present invention are not clarified, but are inferred as follows.

The near-infrared absorbing composition of the present invention is composed of a phosphonic acid compound, two or more kinds of phosphoric acid ester compounds or sulfonic acid ester compounds having different structures, and copper ions. More preferably, as the two or more kinds of phosphoric acid ester compounds or sulfonic acid ester compounds having different structures, at least the following compound A and compound B are used in combination, wherein the compound A is selected from relatively lower molecular weight phosphoric acid ester compound or a sulfonic acid ester compound having a structure represented by Formula (II) with the total number of l and m (l+m) is 1 or more and less than 4, and the compound B is selected from the conventional phosphoric acid ester compound or a sulfonic acid ester compound having a structure represented by Formula (II) with the total number of l and m (l+m) is in the range of 4 to 10. Alternatively, the two or more kinds of phosphoric acid ester compounds or sulfonic acid ester compounds having different structures are selected from the relatively lower molecular weight phosphoric acid ester compounds or sulfonic acid ester compounds having a structure represented by Formula (II) with the total number of l and m (l+m) of 1 or more and less than 4. Furthermore, by setting the content of the phosphonic acid to 2.5 times or more on a molar basis with respect to the total content of the phosphoric acid ester compound or the sulfonic acid ester compound, a near-infrared absorbing composition that is excellent in dispersion stability, visible light transmission, near-infrared light absorption, and thinning of the film has been realized.

In the present invention, the phosphoric acid ester compound or sulfonic acid ester compound having the largest molecular weight and the largest contribution of film thickness among the constituent components is reduced in molecular weight, and a plurality of types are combined, or the conventional phosphoric acid ester compound or sulfonic acid ester compound is used in combination. Alternatively, by reducing the content of the phosphoric acid ester compound or the sulfonic acid ester compound with respect to the phosphonic acid, thinning and high visible permeability could be achieved.

That is, in the present invention, a plurality of types of phosphoric acid ester compounds or sulfonic acid ester compounds having a small molecular weight are combined as materials for dispersing the composition composed of phosphonic acid and copper. As a result, the phosphoric acid ester compound or the sulfonic acid ester compound improved the dispersibility even at a relatively low content, and the desired near-infrared absorption characteristics and visible light transmission could be obtained even with a thin film.

When the molecular weight of the phosphoric acid ester compound or sulfonic acid ester compound is large, or the content of phosphonic acid is less than 2.5 times the total content of the phosphoric acid ester compound or sulfonic acid ester compound on a molar basis, the composition consisting of phosphonic acid and copper may be dispersed relatively easily. However, in the present invention, it is presumed that the dispersibility could be improved because of the increased number of isomers and the increased entropy due to the increase in the constituent components of the copper complex. In addition, the molecular weight of the phosphoric acid ester compound or the sulfonic acid ester compound is reduced, or the content of the phosphonic acid is 2.5 times or more on a molar basis with respect to the total content of the phosphoric acid ester compound or the sulfonic acid ester compound. By adopting these means, the absorption characteristics could be improved. It is presumed that this is because the amount of phosphonic acid with respect to copper was increased and the absorption characteristics could be improved by lowering the molecular weight of the phosphoric acid ester compound or the sulfonic acid ester compound and reducing the relative content.

BRIEF DESCRIPTION OF THE DRAWINGS

The FIGURE is a schematic cross-sectional view illustrating an example of a configuration of a camera module having a solid-state imaging element provided with a near-infrared absorbing film of the present invention.

EMBODIMENTS TO CARRY OUT THE INVENTION

A near-infrared absorbing composition of the present invention comprises a near-infrared absorber and a solvent, wherein the near-infrared absorber contains at least one of the following component (A) or component (B), Component (A): a component composed of a phosphonic acid compound represented by the above Formula (I), two or more kinds of phosphoric acid ester compounds or sulfonic acid ester compounds having different structures, and copper ions; and Component (B): a component composed of a copper complex obtained by a reaction of a phosphonic acid compound represented by the above Formula (I), two or more kinds of phosphoric acid ester compounds or sulfonic acid ester compounds having different structures, and a copper compound. This feature is a technical feature common to the present inventions according to the following embodiments.

In the near-infrared absorbing composition of the present invention, the following embodiment is one of more preferable embodiments from the viewpoint of more exhibiting the desired effect of the present invention. The two or more kinds of phosphoric acid ester compounds or sulfonic acid ester compounds having different structures in the component (A) and the component (B) contain a compound A and a compound B, wherein the compound A has a structure represented by the above Formula (II), and is selected from the phosphoric acid ester compound or the sulfonic acid ester compound in which l and m each are respectively 0 or more, and the total number of l and m (l+m) is 1 or more and less than 4, and the compound B has a structure represented by the above Formula (II), and is selected from the phosphoric acid ester compound or the sulfonic acid ester compound in which l and m each are respectively 0 or more, and the total number of l and m (l+m) is in the range of 4 to 10. With this configuration, the above-mentioned objective effect of the present invention may be more exhibited.

Further, a particularly preferable embodiment is as follows. The two or more kinds of phosphoric acid ester compounds or sulfonic acid ester compounds having different structures in the component (A) and the component (B) are composed of at least two compounds selected from the phosphoric acid ester compounds or sulfonic acid ester compounds having a structure represented by the above Formula (II). With this configuration, sufficient thinning may be achieved, and more excellent near-infrared absorption may be improved without impairing light transmission in the visible light region.

Furthermore, setting the content of the phosphonic acid to 2.5 times or more on a molar basis with respect to the total content of the phosphoric acid ester compound or the sulfonic acid ester compound is preferable in that the effect of the present invention may be more exhibited.

Further, in a system in which the compound A and the compound B are used in combination as a phosphoric acid ester compound and a sulfonic acid ester compound, the effect of the present invention may be further exhibited by setting the composition ratio of the compound A having a low molecular weight to be 50% by mass or more.

Further, it is preferable that the mass absorbance is 0.30 L/(g·cm) or more because excellent absorption characteristics may be obtained with a low content and thinning may be promoted.

In addition, by setting the average particle size of the near-infrared absorber to 100 nm or less, the dispersibility is improved, the light scattering is suppressed and high transparency may be obtained. This is one of preferable embodiments.

Further, it is preferable to contain a near-infrared absorption modifier having a maximum absorption wavelength in the wavelength range of 650 to 1000 nm in that a more excellent near-infrared absorption ability may be obtained.

Further, the near-infrared absorbing composition of the present invention provides a near-infrared absorbing film which is excellent in dispersion stability, visible light transmittance and near-infrared light absorption and can reduce the film thickness. In addition, it is possible to realize an image sensor for a solid-state imaging element provided with the near-infrared absorbing film.

Hereinafter, the present invention and the constitution elements thereof, as well as configurations and embodiments to carry out the present invention, will be detailed in the following. In the present description, when two figures are used to indicate a range of value before and after "to", these figures are included in the range as a lowest limit value and an upper limit value.

<<Configuration of Near-Infrared Absorbing Composition>>

The near-infrared absorbing composition of the present invention has a configuration of containing a near-infrared absorber and a solvent.

[Near-Infrared Absorber]

The near-infrared absorber according to the present invention is characterized by containing at least one of the following component (A) or component (B).

Component (A): a component composed of a phosphonic acid compound represented by the following Formula (I), two or more kinds of phosphoric acid ester compounds or sulfonic acid ester compounds having different structures, and copper ions.

Component (B): a component composed of a copper complex obtained by a reaction of a phosphonic acid compound represented by the following Formula (I), two or more kinds of phosphoric acid ester compounds or sulfonic acid ester compounds having different structures, and a copper compound.

Further, as the first embodiment, it is preferable that two or more kinds of phosphoric acid ester compounds or sulfonic acid ester compounds having different structures in the component (A) and the component (B) are composed of at least the following compound A and compound B, wherein the compound A has a structure represented by the above Formula (II), and is selected from the phosphoric acid ester compound or the sulfonic acid ester compound in which l and m each are respectively 0 or more, and the total number of l and m (l+m) is 1 or more and less than 4, and the compound B has a structure represented by the above Formula (II), and is selected from the phosphoric acid ester compound or the sulfonic acid ester compound in which l and m each are respectively 0 or more, and the total number of l and m (l+m) is in the range of 4 to 10.

Further, as the second embodiment, it is preferable that two or more kinds of phosphoric acid ester compounds or sulfonic acid ester compounds having different structures in the component (A) and the component (B) are at least two compounds selected from the phosphoric acid ester compounds or the sulfonic acid ester compounds having a structure represented by the following Formula (II) in which the total number of l and m (l+m) is 1 or more and less than 4.

Further, the content of phosphonic acid is preferably 2.5 times or more, more preferably 2.5 to 3.5 times, based on a molar basis, with respect to the total content of the phosphoric acid ester compound or the sulfonic acid ester compound.

When the phosphonic acid content is less than 2.5 times the total content of the phosphoric acid ester compound or sulfonic acid ester compound on a molar basis, the phosphoric acid ester compound or sulfonic acid ester compound having low effectiveness for absorption characteristics tends to be excessive, and it tends to be difficult to thin the near-infrared absorption film.

When the phosphonic acid content is 2.5 times or more on a molar basis with respect to the total content of the phosphoric acid ester compound or the sulfonic acid ester compound, the proportion of phosphonic acid effective for absorption characteristics is increased, and the absorption characteristics may be enhanced.

Further, when the content of phosphonic acid exceeds 3.5 times the total content of the phosphoric acid ester compound or the sulfonic acid ester compound on a molar basis, the proportion of phosphoric acid ester compound or sulfonic acid ester compound that contributes to dispersibility becomes insufficient, and the near-infrared absorption film tends to become cloudy. It is preferable to avoid this case.

[Compound Having a Structure Represented by Formula (II)]

First, a compound having a structure represented by the following Formula (II) according to the present invention will be described.

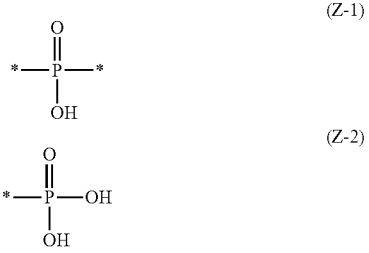

Formula (II)

In the above Formula (II), R represents an alkyl group having 1 to 20 carbon atoms or an aryl group having 6 to 20 carbon atoms, R may further have a substituent.

Z represents a structural unit selected from Formulas (Z-1), (Z-2) and (Z-3) below.

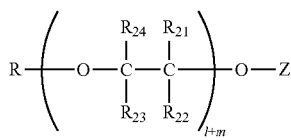

(Z-1)

(Z-2)

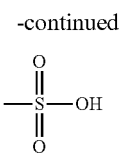

(Z-3)

An asterisk (*) described in the above Formulas (Z-1) to (Z-3) represents a binding site and binds O in the above Formula (II) to form a phosphoric acid ester compound or a sulfonic acid ester compound.

In the structural unit selected from the above Formulas (Z-1), (Z-2) and (Z-3), from the viewpoint of dispersibility of the copper complex, preferable is a structural unit represented by the Formula (Z-1) or (Z-3) having one hydroxy group.

In the above Formula (II), when Z is a structural unit of Formula (Z-1), it becomes a diester, and when Z is a structural unit of Formula (Z-2) or (Z-3), it becomes a monoester. From the viewpoint of dispersibility of the copper complex, the diester and the monoester are preferably a mixture, and among the monoester and the diester, the molar ratio of the diester is preferably within a range of 20 to 95%, more preferably within a range of 40 to 80%.

In Formula (II), l represents a number of partial structures satisfying the condition (i) described later, m represents a number of partial structures satisfying the condition (ii) described later. The compound A according to the present invention is a phosphoric acid ester compound or a sulfonic acid ester compound in which l and m each are respectively 0 or more, the total number of l and m (l+m) is 1 or more and less than 4. The compound B is a phosphoric acid ester compound or a sulfonic acid ester compound in which l and m each are respectively 0 or more, and the total number of l and m (l+m) is in the range of 4 to 10.

In the above Formula (II), the alkyl group having 1 to 20 carbon atoms represented by R may be a straight chain or a branched chain. Examples of the alkyl group include a methyl group, an ethyl group, an n-propyl group, an isopropyl group, an n-butyl group, a tert-butyl group, an n-hexyl group, a 2-ethylhexyl group, an n-octyl group, a 2-butyloctyl group, a 2-hexyloctyl group, an n-decyl group, a 2-hexyldecyl group, an n-dodecyl group, and an n-stearyl group. Each alkyl group may further have a substituent. From the viewpoint of absorption properties of the copper complex, it is preferably an alkyl group having 1 to 10 carbon atoms.

Examples of the aryl group having a carbon number of 6 to 20 represented by R include a phenyl group, a mesityl group, a tolyl group, a xylyl group, a naphthyl group, an anthryl group, an azulenyl group, an acenaphthenyl group, a fluorenyl group, a phenyl group, an indenyl group, a pyrenyl group, and a biphenyl group. Among them, a phenyl group, a naphthyl group, a fluorenyl group, a phenanthryl group, a phenanthryl group, a biphenyl group, and a fluorenyl group are preferable. Each aryl group may further have a substituent.

Examples of the substituent which may be possessed by R include an alkyl group (e.g., a methyl group, an ethyl group, a trifluoromethyl group, an isopropyl group), an alkoxy group (e.g., a methoxy group, an ethoxy group), a halogen atom (e.g., a fluorine atom), a cyano group, a nitro group, a dialkylamino group (e.g., a dimethylamino group), a trialkylsilyl group (e.g., a trimethylsilyl group), a triarylsilyl group (e.g., a triphenylsilyl group), a triheteroarylsilyl group (e.g., a tripyridylsilyl group,), a benzyl group, an aryl group (e.g., a phenyl group), a heteroaryl groups (e.g., a pyridyl group, a carbazolyl group). Examples of the condensed ring include 9,9'-dimethylfluorene, carbazole and dibenzofuran, but they are not particularly limited.

In the above Formula (II), $R_{21}$ to $R_{24}$ each respectively represent a hydrogen atom or an alkyl group having 1 to 4 carbon atoms. Examples thereof include a methyl group, an ethyl group, an n-propyl group, and an n-butyl group. From the viewpoint of dispersibility of the copper complex, a methyl group is particularly preferable.

In the compound having a structure represented by Formula (II) according to the present invention, it is preferable that the compound contains at least one partial structure satisfying the following condition (i) and one partial structure satisfying the condition (ii) simultaneously provided in the molecular structure thereof.

Condition (i): $R_{21}$ to $R_{24}$ all represent a hydrogen atom.

Condition (ii): At least one of $R_{21}$ to $R_{24}$ represents an alkyl group having 1 to 4 carbon atoms.

The partial structure satisfying condition (ii) includes a structure in which at least one of $R_{21}$ to $R_{24}$ is an alkyl group having 1 to 4 carbon atoms, and it include a structure in which two are the alkyl groups, three are the alkyl groups, and all four are the alkyl groups. From the viewpoint of dispersibility of the copper complex, it is preferable that only one of them is an alkyl group having 1 to 4 carbon atoms.

The partial structure satisfying the condition (i) is an ethylene oxide structure in which $R_{21}$ to $R_{24}$ all are a hydrogen atom, and has a high ability to form complexes with metals, which contributes to enhancing dispersibility. On the other hand, condition (ii) is an alkyl-substituted ethylene oxide structure, and has a large number of components, which contributes to enhancing dispersion stability at the time of moisture incorporation due to an entropic effect.

In Formula (II), l represents a number of partial structures in which all of $R_{21}$ to $R_{24}$ defined in the above condition (i) are a hydrogen atom, m represents a number of partial structures in which at least one of $R_{21}$ to $R_{24}$ defined in the above condition (ii) is an alkyl group having 1 to 4 carbon atoms. As described above, in the compound A according to the present invention, l and m each are respectively a number of 0 or more, and the total number of l and m (l+m) is 1 or more and less than 4. Further, in the compound B, l and m each are respectively a number of 0 or more, and the total number of l and m (l+m) is in the range of 4 to 10. In the compound A, it is more preferable that l and m each are respectively 1 or more.

Here, l and m respectively represent an average number of addition moles of the ethylene oxide structure and the alkyl-substituted ethylene oxide structure.

In addition, in the compound having a structure represented by the above Formula (II), it is preferable that the compound has at least one of the partial structures satisfying the following condition (i) or the partial structures satisfying the following condition (ii), or alternatively, it is preferable that the compound has at least both of the partial structures satisfying the following condition (i) and the partial structures satisfying the following condition (ii) at the same time.

Condition (i): $R_{21}$ to $R_{24}$ all represent a hydrogen atom.

Condition (ii): At least one of $R_{21}$ to $R_{24}$ represents an alkyl group having 1 to 4 carbon atoms, and other three represent a hydrogen atom.

For example, when the alkyl group represented by condition (ii) is a methyl group, it is a compound having an ethylene oxide structure and a propylene oxide structure in the same structure.

In the present application, the term an "ethylene oxide structure" refers to a repeating unit structure of polyethylene oxide. That is, it is a structure in which ethylene oxide, which is a cyclic ether of a three membered ring, is opened. In addition, a "propylene oxide structure" refers to a repeating unit structure of polypropylene oxide. That is, it is a structure in which propylene oxide, which is a cyclic ether of a three membered ring, is opened.

Next, specific examples of the compound having a structure represented by Formula (II) will be described.

First, an example of the structure of a representative exemplary compound will be described.

<Exemplary Compound 11>

An exemplary compound 11 is shown in Table I below, and it has the following structure.

R: an ethyl group
Condition (i): $R_{21}$ to $R_{24}$=H
Condition (ii): $R_{21}$=H, $R_{22}$=H, $R_{23}$=a methyl group, $R_{24}$=H
Z: Z-1, Z-2
l: 1.5
m: 1.5

It is represented by the structure of an exemplary compound (11-1) in which Z is Z-2 and an exemplary compound (11-2) in which Z is Z-1.

Exemplary compound (11-1)

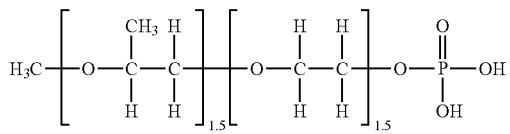

Exemplary compound (11-2)

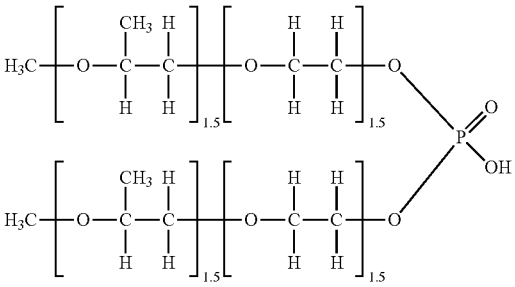

In the case of the exemplary compound 11, the monoester ratio is 50%, and the above-mentioned exemplary compound (11-1) and the exemplary compound (11-2) are each contained in the same molar amount.

In the exemplary compound 11, the order of the ethylene oxide structure and the alkyl-substituted ethylene oxide structure may be arbitrarily changed by the synthetic method to be applied, and the following exemplary compounds (11-3) and (11-4) are also included in the exemplary compound 11.

Exemplary compound (11-3)

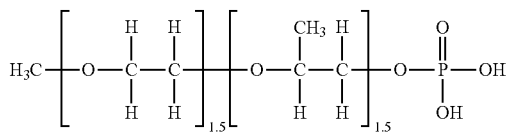

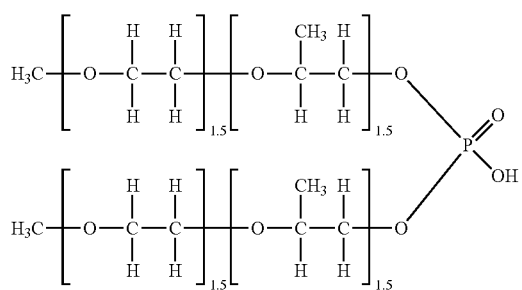

Exemplary compound (11-4)

In the present invention, the order of the ethylene oxide structure and the alkyl-substituted ethylene oxide structure is not particularly limited, and a compound in which each structure is randomly arranged is also included in the compound defined in the present invention.

Specific examples of the compound A and the compound B having the structure represented by Formula (II) are then listed in Table I to Table IV below, but the present invention is not limited to these exemplary compounds. In the table below, the compound having a numerical value less than 4 in the (l+m) column is a compound A, and the compound in the range of 4 to 10 is a compound B.

TABLE I

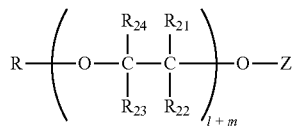

Formula (II)

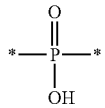

(Z-1)

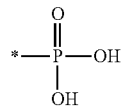

(Z-2)

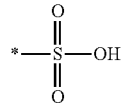

(Z-3)

| Exemplary compound No. | R Type | Carbon atom number | Partial structure of Condition (i) l | $R_{21}$~$R_{24}$ | Partial structure of Condition (ii) m | $R_{21}$ | $R_{22}$ | $R_{23}$ | $R_{24}$ | l + m | Z | Monoester ratio [%] |
|---|---|---|---|---|---|---|---|---|---|---|---|---|
| 1 | Methyl | 1 | 5.0 | H | 0 | — | — | — | — | 5.0 | Z-1, Z-2 | 50 |
| 2 | Methyl | 1 | 3.0 | H | 0 | — | — | — | — | 3.0 | Z-1, Z-2 | 50 |
| 3 | Methyl | 1 | 2.0 | H | 3.0 | H | H | Methyl | H | 5.0 | Z-1, Z-2 | 50 |
| 4 | Methyl | 1 | 3.0 | H | 3.0 | H | H | Methyl | H | 6.0 | Z-1, Z-2 | 70 |
| 5 | Methyl | 1 | 1.5 | H | 1.5 | H | H | Methyl | H | 3.0 | Z-1, Z-2 | 50 |
| 6 | Methyl | 1 | 1.0 | H | 1.0 | H | H | Methyl | H | 2.0 | Z-3 | — |
| 7 | Methyl | 2 | 5.0 | H | 0 | — | — | — | — | 5.0 | Z-1, Z-2 | 50 |
| 8 | Methyl | 2 | 3.0 | H | 0 | — | — | — | — | 3.0 | Z-1, Z-2 | 50 |
| 9 | Methyl | 2 | 1.0 | H | 0 | — | — | — | — | 1.0 | Z-1, Z-2 | 50 |
| 10 | Methyl | 2 | 1.0 | H | 3.0 | H | H | Methyl | H | 4.0 | Z-1, Z-2 | 30 |
| 11 | Methyl | 2 | 1.5 | H | 1.5 | H | H | Methyl | H | 3.0 | Z-1, Z-2 | 50 |
| 12 | Methyl | 2 | 1.0 | H | 1.0 | Methyl | H | H | H | 2.0 | Z-3 | — |
| 13 | n-Propyl | 3 | 4.0 | H | 0 | — | — | — | — | 4.0 | Z-1, Z-2 | 50 |
| 14 | n-Propyl | 3 | 3.0 | H | 0 | — | — | — | — | 3.0 | Z-1, Z-2 | 50 |
| 15 | n-Propyl | 3 | 1.5 | H | 0 | — | — | — | — | 1.5 | Z-1, Z-2 | 50 |
| 16 | n-Propyl | 3 | 1.5 | H | 1.5 | H | H | Methyl | H | 3.0 | Z-1, Z-2 | 70 |
| 17 | n-Propyl | 3 | 3.0 | H | 2.0 | Methyl | H | Methyl | H | 5.0 | Z-1, Z-2 | 50 |
| 18 | n-Propyl | 3 | 2.0 | H | 2.0 | H | H | Methyl | H | 4.0 | Z-3 | — |
| 19 | iso-Propyl | 3 | 3.0 | H | 3.0 | — | — | — | — | 6.0 | Z-3 | — |
| 20 | iso-Propyl | 3 | 2.5 | H | 5.0 | — | — | — | — | 7.5 | Z-1, Z-2 | 50 |
| 21 | iso-Propyl | 3 | 4.0 | H | 2.0 | Methyl | H | Methyl | H | 6.0 | Z-1, Z-2 | 20 |
| 22 | iso-Propyl | 3 | 2.0 | H | 1.5 | H | H | Methyl | H | 3.5 | Z-1, Z-2 | 80 |
| 23 | n-Butyl | 4 | 2.0 | H | 0 | — | — | — | — | 2.0 | Z-1, Z-2 | 50 |
| 24 | n-Butyl | 4 | 1.0 | H | 1.0 | H | H | Methyl | H | 2.0 | Z-1, Z-2 | 30 |

TABLE I-continued

| No. | Type | Carbon atom number | I | R21~R24 | m | R21 | R22 | R23 | R24 | I + m | Z | Monoester ratio [%] |
|---|---|---|---|---|---|---|---|---|---|---|---|---|
| 25 | n-Butyl | 4 | 1.5 | H | 1.5 | H | H | Methyl | H | 3.0 | Z-1, Z-2 | 50 |
| 26 | n-Butyl | 4 | 2.0 | H | 4.0 | H | H | Methyl | H | 6.0 | Z-1, Z-2 | 50 |
| 27 | n-Butyl | 4 | 3.0 | H | 3.0 | Methyl | H | H | H | 7.0 | Z-3 | — |

TABLE II

| Exemplary compound No. | R Type | Carbon atom number | Partial structure of Condition (i) | | Partial structure of Condition (ii) | | | | | Z | Monoester ratio [%] |
|---|---|---|---|---|---|---|---|---|---|---|---|---|
| | | | I | R21~R24 | m | R21 | R22 | R23 | R24 | I + m | | |
| 28 | iso-Butyl | 4 | 4.0 | H | 0 | — | — | — | — | 4.0 | Z-1, Z-2 | 50 |
| 29 | iso-Butyl | 4 | 1.5 | H | 0 | — | — | — | — | 1.5 | Z-1, Z-2 | 50 |
| 30 | iso-Butyl | 4 | 3.0 | H | 3.0 | H | H | Methyl | H | 6.0 | Z-1, Z-2 | 60 |
| 31 | iso-Butyl | 4 | 2.0 | H | 2.0 | H | H | Methyl | H | 4.0 | Z-1, Z-2 | 50 |
| 32 | tert-Butyl | 4 | 3.0 | H | 0 | — | — | — | — | 3.0 | Z-1, Z-2 | 50 |
| 33 | tert-Butyl | 4 | 1.0 | H | 0 | — | — | — | — | 1.0 | Z-1, Z-2 | 30 |
| 34 | tert-Butyl | 4 | 3.0 | H | 3.0 | H | H | Methyl | H | 6.0 | Z-1, Z-2 | 50 |
| 35 | tert-Butyl | 4 | 2.0 | H | 2.0 | H | H | Methyl | H | 4.0 | Z-3 | — |
| 36 | n-Pentyl | 5 | 3.0 | H | 0 | — | — | — | — | 3.0 | Z-1, Z-2 | 50 |
| 37 | n-Pentyl | 5 | 2.0 | H | 0 | — | — | — | — | 2.0 | Z-1, Z-2 | 30 |
| 38 | n-Pentyl | 5 | 1.0 | H | 2.0 | H | H | Methyl | H | 3.0 | Z-1, Z-2 | 50 |
| 39 | n-Pentyl | 5 | 2.0 | H | 2.0 | H | H | Methyl | H | 4.0 | Z-1, Z-2 | 50 |
| 40 | iso-Pentyl | 5 | 3.0 | H | 0 | — | — | — | — | 3.0 | Z-3 | — |
| 41 | iso-Pentyl | 5 | 1.5 | H | 0 | — | — | — | — | 1.5 | Z-1, Z-2 | 40 |
| 42 | iso-Pentyl | 5 | 3.0 | H | 3.0 | H | H | Methyl | H | 6.0 | Z-1, Z-2 | 50 |
| 43 | iso-Pentyl | 5 | 2.0 | H | 2.0 | H | H | Methyl | H | 4.0 | Z-1, Z-2 | 50 |
| 44 | n-Hexyl | 6 | 1.5 | H | 0 | — | — | — | — | 1.5 | Z-1, Z-2 | 50 |
| 45 | n-Hexyl | 6 | 3.0 | H | 3.0 | H | H | Methyl | H | 6.0 | Z-1, Z-2 | 60 |
| 46 | n-Hexyl | 6 | 1.5 | H | 1.5 | H | H | Methyl | H | 3.0 | Z-1, Z-2 | 50 |
| 47 | n-Hexyl | 6 | 5.0 | H | 5.0 | Methyl | H | Methyl | H | 10.0 | Z-1, Z-2 | 98 |
| 48 | n-Hexyl | 6 | 1.0 | H | 1.0 | H | H | Methyl | H | 2.0 | Z-1, Z-2 | 70 |
| 49 | n-Hexyl | 6 | 2.0 | H | 1.0 | H | H | Methyl | H | 3.0 | Z-1, Z-2 | 60 |
| 50 | n-Hexyl | 6 | 1.0 | H | 3.0 | H | H | Methyl | H | 4.0 | Z-1, Z-2 | 50 |
| 51 | n-Hexyl | 6 | 2.0 | H | 1.0 | H | H | Methyl | H | 3.0 | Z-3 | — |
| 52 | iso-Hexyl | 6 | 2.0 | H | 0 | — | — | — | — | 2.0 | Z-1, Z-2 | 50 |
| 53 | iso-Hexyl | 6 | 1.2 | H | 1.2 | H | H | Methyl | H | 2.4 | Z-1, Z-2 | 50 |
| 54 | iso-Hexyl | 6 | 2.0 | H | 2.0 | H | H | Methyl | H | 4.0 | Z-1, Z-2 | 50 |

TABLE III

| Exemplary compound No. | R Type | Carbon atom number | Partial structure of Condition (i) | | Partial structure of Condition (ii) | | | | | Z | Monoester ratio [%] |
|---|---|---|---|---|---|---|---|---|---|---|---|---|
| | | | I | R21~R24 | m | R21 | R22 | R23 | R24 | I + m | | |
| 55 | n-Octyl | 8 | 1.0 | H | 0 | — | — | — | — | 1.0 | Z-1, Z-2 | 40 |
| 56 | n-Octyl | 8 | 2.0 | H | 2.0 | H | H | Methyl | H | 4.0 | Z-1, Z-2 | 50 |
| 57 | n-Octyl | 8 | 1.0 | H | 2.0 | H | H | Methyl | H | 3.0 | Z-1, Z-2 | 50 |
| 58 | n-Octyl | 8 | 3.0 | H | 3.0 | H | H | Methyl | H | 6.0 | Z-1, Z-2 | 50 |
| 59 | n-Octyl | 8 | 2.0 | H | 1.0 | H | H | Methyl | H | 3.0 | Z-1, Z-2 | 60 |
| 60 | n-Octyl | 8 | 1.5 | H | 1.5 | H | H | Methyl | H | 3.0 | Z-1, Z-2 | 50 |
| 61 | 2-Ethylhexyl | 8 | 3.0 | H | 0 | — | — | — | — | 3.0 | Z-1, Z-2 | 50 |
| 62 | 2-Ethylhexyl | 8 | 2.0 | H | 2.0 | H | H | Methyl | H | 4.0 | Z-1, Z-2 | 40 |
| 63 | 2-Ethylhexyl | 8 | 2.5 | H | 2.5 | H | H | Methyl | H | 5.0 | Z-1, Z-2 | 50 |
| 64 | 2-Ethylhexyl | 8 | 1.5 | H | 1.5 | H | H | Methyl | H | 3.0 | Z-1, Z-2 | 50 |
| 65 | 2-Ethylhexyl | 8 | 1.0 | H | 2.0 | Methyl | H | H | H | 3.0 | Z-1, Z-2 | 30 |
| 66 | 2-Ethylhexyl | 8 | 2.0 | H | 1.0 | H | H | Methyl | H | 3.0 | Z-3 | — |
| 67 | iso-Octyl | 8 | 2.5 | H | 0 | — | — | — | — | 2.5 | Z-1, Z-2 | 40 |
| 68 | iso-Octyl | 8 | 5.0 | H | 5.0 | Methyl | H | Methyl | H | 10.0 | Z-1, Z-2 | 18 |
| 69 | iso-Octyl | 8 | 1.2 | H | 1.8 | H | H | Methyl | H | 3.0 | Z-1, Z-2 | 50 |
| 70 | iso-Octyl | 8 | 2.0 | H | 3.0 | H | H | Methyl | H | 5.0 | Z-1, Z-2 | 50 |
| 71 | n-Decyl | 10 | 1.5 | H | 0 | — | — | — | — | 1.5 | Z-1, Z-2 | 50 |
| 72 | n-Decyl | 10 | 3.0 | H | 3.0 | H | H | Methyl | H | 6.0 | Z-1, Z-2 | 50 |

TABLE III-continued

| Exemplary compound | | Carbon atom | Partial structure of Condition (i) | | Partial structure of Condition (ii) | | | | | | Monoester |
|---|---|---|---|---|---|---|---|---|---|---|---|
| No. | Type | number | I | $R_{21}$~$R_{24}$ | m | $R_{21}$ | $R_{22}$ | $R_{23}$ | $R_{24}$ | I + m | Z | ratio [%] |
| 73 | n-Decyl | 10 | 1.0 | H | 1.0 | H | H | Methyl | H | 2.0 | Z-1, Z-2 | 50 |
| 74 | n-Decyl | 10 | 2.0 | H | 5.0 | Methyl | Methyl | H | H | 7.0 | Z-1, Z-2 | 95 |
| 75 | iso-Decyl | 10 | 2.0 | H | 0 | — | — | — | — | 2.0 | Z-1, Z-2 | 50 |
| 76 | iso-Decyl | 10 | 3.0 | H | 3.0 | H | H | Methyl | H | 6.0 | Z-1, Z-2 | 50 |
| 77 | iso-Decyl | 10 | 2.0 | H | 2.0 | H | H | Methyl | H | 4.0 | Z-1, Z-2 | 50 |
| 78 | n-Dodecyl | 12 | 2.0 | H | 0 | — | — | — | — | 2.0 | Z-1, Z-2 | 50 |
| 79 | n-Dodecyl | 12 | 3.0 | H | 0 | — | — | — | — | 3.0 | Z-1, Z-2 | 50 |
| 80 | n-Dodecyl | 12 | 4.0 | H | 0 | — | — | — | — | 4.0 | Z-1, Z-2 | 50 |
| 81 | n-Dodecyl | 12 | 1.5 | H | 1.5 | H | H | Methyl | H | 3.0 | Z-1, Z-2 | 50 |
| 82 | n-Dodecyl | 12 | 2.0 | H | 2.0 | H | H | Methyl | H | 4.0 | Z-1, Z-2 | 60 |
| 83 | n-Dodecyl | 12 | 1.0 | H | 1.0 | H | H | Methyl | H | 2.0 | Z-1, Z-2 | 50 |
| 84 | n-Dodecyl | 12 | 1.3 | H | 1.7 | H | H | Methyl | H | 3.0 | Z-1, Z-2 | 30 |
| 85 | n-Dodecyl | 12 | 0 | — | 3.0 | H | H | Methyl | H | 3.0 | Z-1, Z-2 | 50 |
| 86 | n-Dodecyl | 12 | 1.5 | H | 1.5 | H | H | Methyl | H | 3.0 | Z-3 | 0 |
| 87 | n-Dodecyl | 12 | 3.0 | H | 3.0 | H | H | Methyl | H | 6.0 | Z-1, Z-2 | 50 |

TABLE IV

| Exemplary compound | | Carbon atom | Partial structure of Condition (i) | | Partial structure of Condition (ii) | | | | | | Monoester |
|---|---|---|---|---|---|---|---|---|---|---|---|
| No. | Type | number | I | $R_{21}$~$R_{24}$ | m | $R_{21}$ | $R_{22}$ | $R_{23}$ | $R_{24}$ | I + m | Z | ratio [%] |
| 88 | 2-Butyloctyl | 12 | 3.0 | H | 0 | — | — | — | — | 3.0 | Z-1, Z-2 | 50 |
| 89 | 2-Butyloctyl | 12 | 1.0 | H | 1.0 | H | H | Methyl | H | 2.0 | Z-1, Z-2 | 50 |
| 90 | 2-Butylootyl | 12 | 1.0 | H | 2.0 | H | H | Methyl | H | 3.0 | Z-1, Z-2 | 50 |
| 91 | 2-Butyloctyl | 12 | 2.0 | H | 2.0 | H | H | Methyl | H | 4.0 | Z-1, Z-2 | 50 |
| 92 | 2-Hexyloctyl | 14 | 1.0 | H | 1.5 | H | H | Methyl | H | 2.5 | Z-1, Z-2 | 50 |
| 93 | 2-Hexyloctyl | 14 | 2.0 | H | 3.0 | H | H | Methyl | H | 5.0 | Z-1, Z-2 | 30 |
| 94 | n-Pentadecyl | 15 | 1.5 | H | 0 | — | — | — | — | 1.5 | Z-1, Z-2 | 50 |
| 95 | n-Pentadecyl | 15 | 3.0 | H | 2.0 | H | H | Methyl | H | 5.0 | Z-1, Z-2 | 50 |
| 96 | n-Pentadecyl | 15 | 1.0 | H | 1.0 | H | H | Methyl | H | 2.0 | Z-1, Z-2 | 50 |
| 97 | n-Stearyl | 16 | 3.0 | H | 3.0 | H | H | Methyl | H | 6.0 | Z-1, Z-2 | 70 |
| 98 | n-Stearyl | 16 | 1.2 | H | 2.4 | H | H | Methyl | H | 3.6 | Z-1, Z-2 | 70 |
| 99 | n-Stearyl | 16 | 3.0 | H | 3.0 | H | H | Methyl | H | 6.0 | Z-3 | — |
| 100 | Octadecyl | 18 | 1.5 | H | 1.5 | H | H | Methyl | H | 3.0 | Z-1, Z-2 | 50 |
| 101 | Phenyl | 6 | 2.5 | H | 0 | — | — | — | — | 2.5 | Z-1, Z-2 | 50 |
| 102 | Phenyl | 6 | 3.0 | H | 3.0 | H | H | Methyl | H | 6.0 | Z-1, Z-2 | 50 |
| 103 | Phenyl | 6 | 1.0 | H | 1.0 | H | H | Methyl | H | 2.0 | Z-1, Z-2 | 50 |
| 104 | Xylyl | 8 | 1.5 | H | 1.5 | H | H | Methyl | H | 3.0 | Z-1, Z-2 | 50 |

A compound having a structure represented by Formula (II) according to the present invention may be synthesized with reference to known methods described in, for example, JP-A 2005-255608, JP-A 2015-000396, JP-A 2015-000970, JP-A 2015-178072, JP-A 2015-178073, and Japanese Patent No. 4422866.

<Synthesis of Exemplary Compound>

Next, representative examples of the synthesis of a compound A and a compound B having the structure represented by the general formula (II) according to the present invention will be given, but the present invention is not limited to these synthetic methods.

<Synthesis of Exemplary Compound 56 (Compound B)>

130 g (1.0 mol) of n-octanol was placed in an autoclave, 116 g (2.0 mol) of propylene oxide was added under the conditions of pressure of 147 kPa and a temperature of 130° C. using potassium hydroxide as a catalyst, and then 88 g of ethylene oxide (2.0 mol) was added.

Next, after confirming that no n-octanol remained, the above adduct was taken into a reactor, and a toluene solution of 47 g (0.33 mol) of phosphoric acid anhydride was reacted at 80° C. for 5 hours, and then washed with distilled water. Then, the solvent was distilled off under reduced pressure to obtain an exemplary compound 56 (R=an octyl group, condition (i): $R_{21}$=H, $R_{22}$=H, $R_{23}$=H, $R_{24}$=H, condition (ii): $R_{22}$=H, $R_{22}$=H, $R_{23}$=a methyl group, $R_{24}$=H, l: 2.0, m: 2.0, Z: phosphoric acid monoester (Z-2)/phosphoric acid diester (Z-1)).

Exemplary compound 56

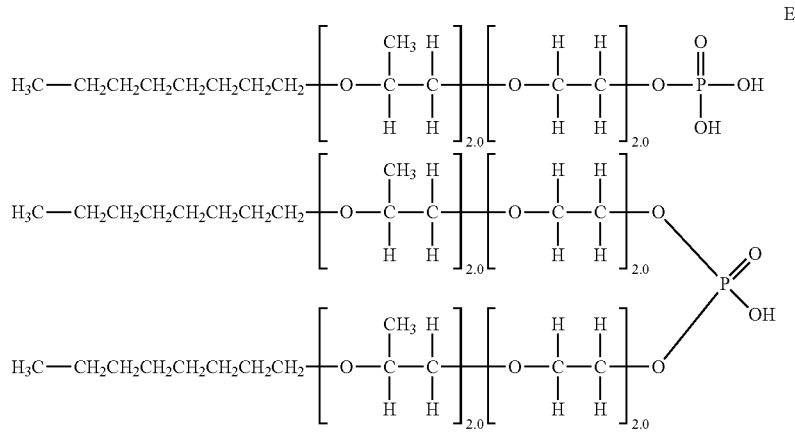

<Synthesis of Exemplary Compound 57 (Compound A)>

130 g (1.0 mol) of n-octanol was placed in an autoclave, and 116 g (2.0 mol) of propylene oxide was added under conditions of a pressure of 147 kPa and a temperature of 130° C. using potassium hydroxide as a catalyst, then 44 g (1.0 mol) of ethylene oxide was added.

Next, after confirming that no n-octanol remained, the above adduct was taken into a reactor, and a toluene solution of 47 g (0.33 mol) of phosphoric acid anhydride was reacted at 80° C. for 5 hours, and then washed with distilled water. Then, the solvent was distilled off under reduced pressure to obtain an exemplary compound 57 (R=a 2-ethylhexyl group, condition (i): $R_{21}$=H, $R_{22}$=H, $R_{23}$=H, $R_{24}$=H, condition (ii): $R_{21}$=H, $R_{22}$=H, $R_{23}$=a methyl group, $R_{24}$=H, l: 1.0, m: 2.0, Z: phosphoric acid monoester (Z-2)/phosphoric acid diester (Z-1)).

<Synthesis of Exemplary Compound 63 (Compound B)>

130 g (1.0 mol) of 2-ethylhexanol was placed in an autoclave, and 145 g (2.5 mol) of propylene oxide was added under conditions of a pressure of 147 kPa and a temperature of 130° C., using potassium hydroxide as a catalyst, then 110 g (2.5 mol) of ethylene oxide was added.

Next, after confirming that no 2-ethylhexanol remained, the above adduct was taken into a reactor, and a toluene solution of 47 g (0.33 mol) of phosphoric acid anhydride was reacted at 80° C. for 5 hours, followed by washing with distilled water, and the solvent was distilled off under reduced pressure to obtain an exemplary compound 63 (R=a 2-ethylhexyl group, condition (i): $R_{21}$=H, $R_{22}$=H, $R_{23}$=H, $R_{24}$=H, condition (ii): $R_{21}$=H, $R_{22}$=H, $R_{23}$=a methyl group, $R_{24}$=H, l: 2.5, m: 2.5, Z: phosphoric acid monoester (Z-2)/phosphoric acid diester (Z-1))).

Exemplary compound 57

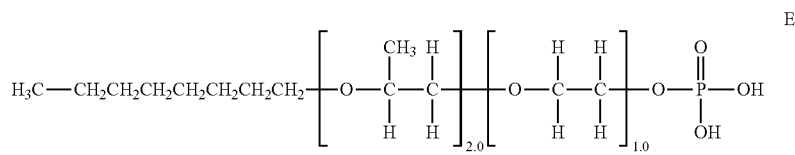

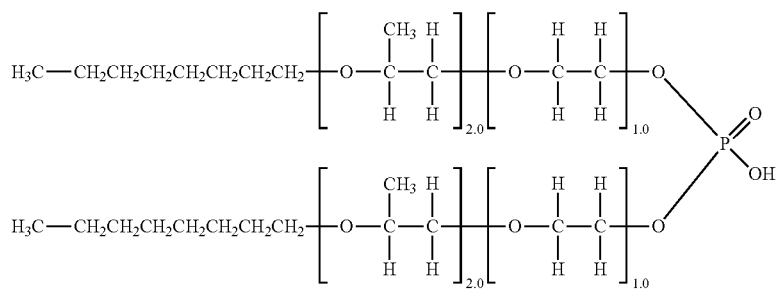

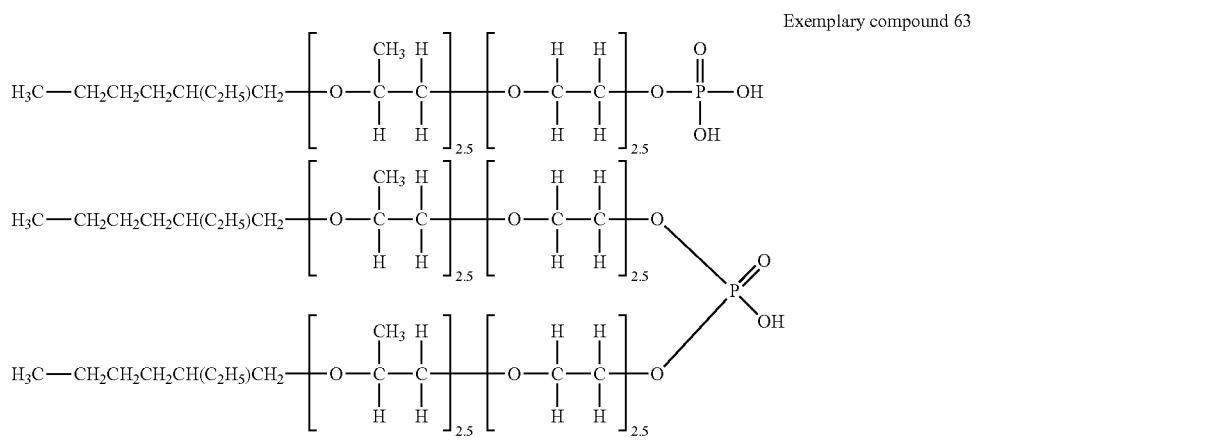

Exemplary compound 63

<Synthesis of Exemplary Compound 64 (Compound A)>

130 g (1.0 mol) of 2-ethylhexanol was placed in an autoclave, and 87 g (1.5 mol) of propylene oxide was added under conditions of a pressure of 147 kPa and a temperature of 130° C., using potassium hydroxide as a catalyst, then 66 g (1.5 mol) of ethylene oxide was added.

Next, after confirming that no 2-ethylhexanol remained, the above adduct was taken into a reactor, and a toluene solution of 47 g (0.33 mol) of phosphoric acid anhydride was reacted at 80° C. for 5 hours, followed by washing with distilled water, and the solvent was distilled off under reduced pressure to obtain an exemplary compound 64 (R=a 2-ethylhexyl group, condition (i): $R_{21}$=H, $R_{22}$=H, $R_{23}$=H, $R_{24}$=H, condition (ii): $R_{21}$=H, $R_{22}$=H, $R_{23}$=a methyl group, $R_{24}$=H, l: 1.5, m: 1.5, Z: phosphoric acid monoester (Z-2)/phosphoric acid diester (Z-1))).

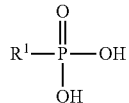

Formula (I)

In the above Formula (I), $R^1$ represents a branched, a straight or a cyclic alkyl group having 1 to 30 carbon atoms, an alkenyl group, an alkynyl group, an aryl group or an aryl group. At least one hydrogen atom may or may not be substituted with a halogen atom, an oxyalkyl group, a polyoxyalkyl group, an oxyaryl group, a polyoxyaryl group, an acyl group, an aldehyde group, a carboxy group, a hydroxy group, or a group having an aromatic ring.

Examples of the phosphonic acid compound having a structure represented by Formula (I) include ethylphosphonic acid, propylphosphonic acid, butylphosphonic acid, pentylphosphonic acid, hexylphosphonic acid, octylphosphonic acid, 2-ethylhexylphosphonic acid, 2-chloroethylphospho- Exemplary compound 64

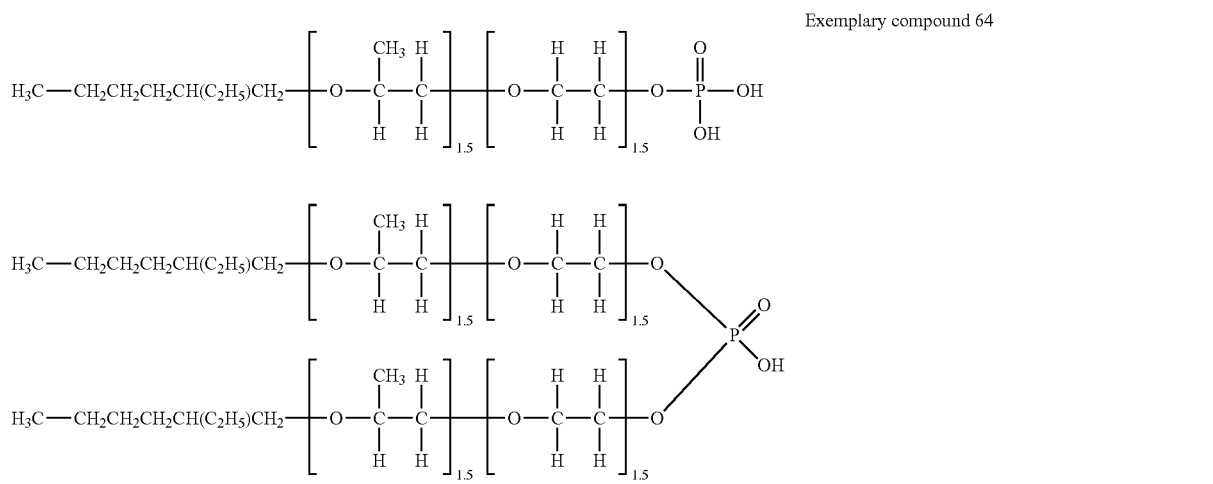

(Phosphonic Acid Compound)

The near-infrared absorbing composition of the present invention is characterized by containing a phosphonic acid compound having a structure represented by the following Formula (I).

nic acid, 3-bromopropylphosphonic acid, 3-methoxybutylphosphonic acid, 1,1-dimethylpropylphosphonic acid, 1-methylpropylphosphonic acid, benzenephosphonic acid, and 4-methoxyphenylphosphonic acid. Examples thereof are shown below as compounds (H-1) to (H-8).

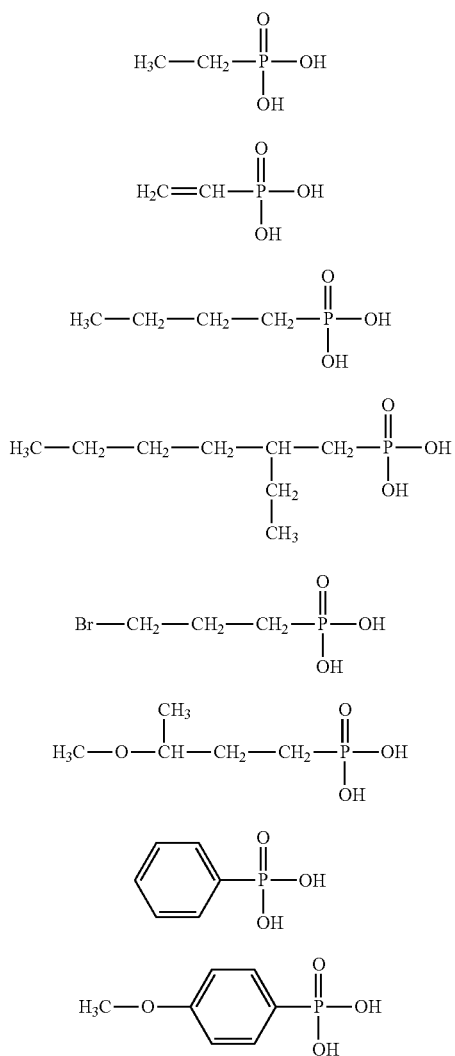

In the present invention, it is preferable that the phosphonic acid constituting the phosphonic acid copper complex is at least one kind of alkylphosphonic acid selected from the following phosphonic acid group.

1: Methylphosphonic acid
2: Ethylphosphonic acid
3: Propylphosphonic acid
4: Butylphosphonic acid
5: Pentylphosphonic acid
6: Hexylphosphonic acid
7: Octylphosphonic acid
8: 2-Ethylhexylphosphonic acid
9: 2-Chloroethylphosphonic acid
10: 3-Bromopropylphosphonic acid
11: 3-Methoxybutylphosphonic acid
12: 1,1-Dimethylpropylphosphonic acid
13: 1,1-Dimethylethylphosphonic acid
14: 1-Methylpropylphosphonic acid

[Copper Component]

As described above, the near-infrared absorber according to the present invention is characterized in that it contains at least one of the component (A) or the component (B). Here, the component (A) is composed of a phosphonic acid compound represented by Formula (I), two or more kinds of phosphoric acid ester compounds or sulfonic acid ester compounds having different structures, and copper ions. The component (B) is composed of a copper complex obtained by a reaction of a phosphoric acid compound represented by Formula (I), two or more kinds of phosphoric acid ester compounds or sulfonic acid ester compounds having different structures, and a copper compound.

As the copper ions in the component (A), or the copper salt in the copper complex obtained by the reaction with the copper compound in the component (B), a copper salt capable of supplying a divalent copper ion is used. Examples thereof include: copper salts of organic acids such as anhydrous copper acetate, anhydrous copper formate, anhydrous copper stearate, anhydrous copper benzoate, anhydrous copper acetoacetate, anhydrous copper ethylacetoacetate, anhydrous copper methacrylate, anhydrous copper pyrophosphate, anhydrous copper naphthenate, and anhydrous copper citrate, hydrates of copper salts of the organic acid; copper salts of inorganic acids such as copper oxide, copper chloride, copper sulfate, copper nitrate, copper phosphate, basic copper sulfate, and basic copper carbonate, hydrates of copper salts of the inorganic acids; and copper hydroxide.

(Copper Complex)

As for the method for synthesizing a copper complex obtained by reacting two or more kinds of phosphoric acid ester compounds or sulfonic acid ester compounds having different structures and a copper compound according to the present invention, for example, a method described in Japanese Patent Nos. 4422866 and 5953322 may be applied.

The two or more kinds of phosphoric acid ester compounds or sulfonic acid ester compounds having different structures according to the present invention are specifically represented by Formula (II). The compound having a structure represented by Formula (II) is bonded to a copper ion by a coordination bond and/or an ionic bond via a phosphate group or a sulfonic acid group represented by Z. This copper ion is dissolved or dispersed in a near-infrared absorbing film while being surrounded by a compound having a structure represented by Formula (II). The near-infrared light is selectively absorbed by electronic transitions between d-orbitals of copper ions. In addition, in the case of a phosphate group which is a typical example of Z, the content of phosphorus atoms in the near-infrared absorbing film is preferably 1.50 or less with respect to 1 mol of copper ions, and more preferably, 0.3 to 1.3. That is, when the content ratio of phosphorus atoms to copper ions (hereinafter referred to as "P/Cu") is 0.3 to 1.3 in molar ratio, it has been confirmed that it is very suitable from the viewpoint of moisture resistance of the near-infrared absorbing film, and moisture resistance of the near-infrared absorbing film and dispersibility of copper ions in the near-infrared absorbing layer.

When a P/Cu value is 0.3 or more in terms of molar ratio, copper ions coordinating to the compound represented by Formula (II) become sufficient amount, and copper ions tend to be uniformly dispersed in the near-infrared absorbing film. On the other hand, when a P/Cu value is 1.3 or less, the occurrence of devitrification may be suppressed when the thickness of the near-infrared absorbing film is reduced to increase the copper ion content. This tendency becomes particularly remarkable in an environment of high temperature and high humidity. Further, it is more preferable that a P/Cu value is 0.8 to 1.3 in terms of molar ratio. When this molar ratio is 0.8 or more, dispersibility of copper ions in the resin may be reliably and sufficiently increased.

Further, by making the content ratio of copper ions in the near-infrared absorbing film to be more than the above lower limit value, it is possible to obtain a sufficient near-infrared absorbing property when the thickness of the near-infrared absorbing film is made thinner than about 1 mm. On the other hand, when the content ratio of copper ions is less than the above upper limit value, it is possible to easily disperse copper ions in the near-infrared absorbing film.

(About Acetic Acid)

In the near-infrared absorbing composition of the present invention, it is preferable to contain 100 mol % or less of acetic acid with respect to the copper ions constituting the component (A) or the copper constituting the copper compound in the copper complex constituting the component (B) contained in the near-infrared absorber.

For example, acetic acid is generated when a copper complex compound is prepared using a compound having a structure represented by Formula (II) and copper acetate.

It is preferable that the amount of acetic acid is within the range specified above in terms of obtaining durability (heat and humidity resistance) and a desired spectral spectrum in the near-infrared region.

[Solvent]

Solvents applicable to the preparation of the near-infrared absorbing compositions of the present invention will be described.

The solvent which may be used in the near-infrared absorbing composition of the present invention is not particularly limited. Examples thereof include a hydrocarbon-based solvent, and more preferably an aliphatic hydrocarbon-based solvent, an aromatic hydrocarbon-based solvent, and a halogen-based solvent.

Examples of the aliphatic hydrocarbon-based solvent include acyclic aliphatic hydrocarbon-based solvents such as hexane and heptane, cyclic aliphatic hydrocarbon-based solvents such as cyclohexane, alcohol-based solvents such as methanol, ethanol, n-propanol, and ethylene glycol, ketone-based solvents such as acetone, methyl ethyl ketone, and ether-based solvents such as diethyl ether, diisopropyl ether, tetrahydrofuran, 1,4-dioxane, and ethylene glycol monomethyl ether. Examples of the aromatic hydrocarbon-based solvent include toluene, xylene, mesitylene, cyclohexylbenzene, and isopropylbiphenyl. Examples of the halogen-based solvent include methylene chloride, 1,1,2-trichloroethane, and chloroform. Further, solvents such as anisole, 2-ethylhexane, sec-butyl ether, 2-pentanol, 2-methyltetrahydrofuran, 2-propylene glycol monomethyl ether, 2,3-dimethyl-1,4-dioxane, sec-butylbenzene, and 2-methylcyclohexylbenzene may be mentioned. Among them, toluene and tetrahydrofuran are preferred from the viewpoint of boiling point and solubility.

In addition, when the ratio of the solid content to the near-infrared absorbing composition is within the range of 5 to 30% by mass, a suitable concentration of the solid matter (for example, copper complex particles) is obtained, and the particles aggregate during the storage period is suppressed, and more excellent storage stability (dispersion stability of copper complex particles and near-infrared light absorbing ability) may be obtained, which is preferable. More preferably, it is within the range of 10 to 20% by mass.

(Near-Infrared Absorption Modifier)

In the near-infrared absorbing composition of the present invention, it is preferable to add at least one near-infrared absorption modifier having an absorption maximum wavelength in a wavelength range of 650 to 800 nm as an additive for adjusting an absorption waveform from the viewpoint of spectral characteristics. As the near-infrared absorption modifier applied to the present invention, it is preferable to apply a near-infrared absorbing dye having an absorption maximum wavelength in a wavelength range of 650 to 800 nm.

Examples of the near-infrared absorbing dye suitable for the present invention include a cyanine dye, a squarylium dye, a croconium dye, an azo dye, an anthraquinone dye, a naphthoquinone dye, a phthalocyanine dye, a naphthalocyanine dye, a quaterrylene dye, and a dithiol metal complex dye. Among them, a phthalocyanine dye, a naphthalocyanine dye, and a quaterrylene dye are particularly preferred in terms of sufficiently absorbing near-infrared light, high visible light transmittance, and high heat resistance.

Specific examples of the phthalocyanine compound include the compounds described in, for example, JP-A 2000-26748, JP-A 2000-63691, JP-A 2001-106689, JP-A 2004-149752, JP-A 2004-18561, JP-A 2005-220060, JP-A 2007-169343, JP-A 2016-204536, and JP-A 2016-218167. These compounds may be synthesized according to the method described in these publications.

Specific examples of the quaterrylene-based dye include the compounds described in, for example, JP-A 2008-009206 and JP-A 2011-225608, and they may be synthesized according to the method described in these publications.

The near-infrared absorbing dye is also available as a commercial product. Examples thereof which may be mentioned include: FDR002, FDR003, FDR004, FDR005, and FDN001 (manufactured by Yamada Chemical Industry Co., Ltd.); Excolor TX-EX720, and Excolor TX-EX708K (manufactured by Nippon Schokubai Co., Ltd.); Lumogen IR765, and Lumogen IR788 (manufactured by BASF Co., Ltd.); ABS694, IRA735, IRA742, IRA751, IRA764, IRA788, and IRA800 (manufactured by Exciton Co., Ltd.); Epolight 5548, Epolight 5768 (manufactured by Aako Co., Ltd.); VIS680E, VIS695A, NIR700B, NIR735B, NIR757A, NIR762A, NIR775B, NIR778A, NIR783C, NIR783I, NIR790B, and NIR795A (manufactured by QCR Solutions Corp.); DLS740A, DLS740B, DLS740C, DLS744A, DLS745B, DLS771A, DLS774A, DLS774B, DLS775A, DLS775B, DLS780A, DLS780C, and DLS782F (manufactured by Crystalin Co., Ltd.); and B4360, B4361, D4773, and D5013 (manufactured by Tokyo Chemical Industry Co., Ltd.).

The amount of the near-infrared absorbing dye to be added is preferably within a range of 0.01 to 0.1% by mass based on 100% by mass of the near-infrared absorber constituting the near-infrared absorbing composition.

When the amount of the near-infrared absorbing dye added is 0.01% by mass or more based on 100% by mass of the near-infrared absorber, the near-infrared light absorption may be sufficiently increased, and when the amount is 0.1% by mass or less, the visible light transmittance of the obtained near-infrared absorbing composition is not impaired.

(UV Absorber)

In the near-infrared absorbing composition of the present invention, it is preferable to further contain an ultraviolet absorber in addition to a near-infrared absorber and a solvent from the viewpoint of spectroscopic characteristics and light resistance.

The ultraviolet absorption is not particularly limited, and examples thereof include a benzotriazole-based ultraviolet absorber, a benzophenone-based ultraviolet absorber, a salicylic ester-based ultraviolet absorber, a cyanoacrylate-based ultraviolet absorber, and a triazine-based ultraviolet absorber.

Examples of the benzotriazole-based ultraviolet absorber include 5-chloro-2-(3,5-di-oxybutyl-2-hydroxylphenyl)2H-benzotriazole, and (2-2H-benzotriazole-2-yl)-6-(linear and side chain dodecyl)-4-methylphenol. Further, a benzotriazole-based ultraviolet absorber may be obtained as a commercially available product. Examples thereof are a TINUVIN series such as TINUVIN 109, TINUVIN 171, TINUVIN 234, TINUVIN 326, TINUVIN 327, TINUVIN 328, and TINUVIN 928. All of them are commercially available products manufactured by BASF Co., Ltd.

Examples of the benzophenone-based ultraviolet absorber include 2-hydroxy-4-benzyloxybenzophenone, 2,4-benzyloxybenzophenone, 2,2'-dihydroxy-4-methoxybenzophenone, 2-hydroxy-4-methoxy-5-sulfobenzophenone, and bis (2-methoxy-4-hydroxy-5-benzoylphenylmethane).

Examples of the salicylic ester-based ultraviolet absorber include phenyl salicylate and p-tert-butyl salicylate.

Examples of the cyanoacrylate-based ultraviolet absorber include 2'-ethylhexyl-2-cyano-3,3-diphenylacrylate and ethyl-2-cyano-3-(3',4'-methylenedioxyphenyl)-acrylate.

Examples of the triazine-based ultraviolet absorber include 2-(2'-hydroxy-4'-hexyloxyphenyl)-4,6-diphenyltriazine. As a commercially available product of the triazine-based ultraviolet absorber, for example, TINUVIN477 (manufactured by BASF Co., Ltd.) is mentioned.

The amount of the ultraviolet absorber to be added is preferably within a range of 0.1 to 5.0% by mass based on 100% by mass of the near-infrared absorber constituting the near-infrared absorbing composition.

When the amount of the ultraviolet absorber added is 0.1% by mass or more based on 100% by mass of the near-infrared absorber, the light resistance may be sufficiently increased, and when the amount is 5.0% by mass or less, the visible light transmittance of the obtained near-infrared absorbing composition is not impaired.

[Mass Absorbance]

In the near-infrared absorbing composition of the present invention, the mass absorbance is preferably 0.30 L/(g·cm) or more.

The mass absorbance referred to in the present invention may be determined according to the following method.

A measurement sample is prepared by diluting the near-infrared absorber with toluene so that the solid content concentration of the near-infrared absorber is 0.5% by mass. The absorbance of this measurement sample is measured at room temperature using a spectrophotometer U-3010 (manufactured by Hitachi, Ltd.) with a 1 cm quartz cell. The intensity of the peak top appearing in the range of 700 to 900 nm may be measured, and the mass absorbance may be calculated by the following equation.

Mass absorbance L/(g·cm)=(Absorbance of diluted solution)/(Solid content concentration (g/L))

The specific gravity of toluene was set to 0.867 g/mL for calculation.

[Average Particle Size of Near-Infrared Absorber]

In the near-infrared absorbing composition of the present invention, the average particle size of the contained near-infrared absorber is preferably 100 nm or less, more preferably in the range of 1 to 80 nm, and particularly preferably, it is in the range of 5 to 60 nm.

In the present invention, the average particle size of the near-infrared absorber may be determined by measuring according to the following method, for example.

For the near-infrared absorbing composition, a measurement sample is prepared by diluting with toluene so that the particle concentration (solid content concentration) of the near-infrared absorber, which is a particle, is 1.0% by mass.

An average particle diameter of the sample may be determined by a dynamic light scattering method using, for example, a zeta potential/particle diameter measuring system ELSZ-1000ZS manufactured by Otsuka Electronics Co., Ltd. as a measuring device.

<<Near-Infrared Absorbing Film>>

In the present invention, it is one of characteristics that a near-infrared absorbing film is formed using the near-infrared absorbing composition of the present invention.

(Matrix Resin)

The near-infrared absorbing film of the present invention is formed by adding a matrix resin to a near-infrared absorbing composition according to the present invention, and dispersing, for example, metal complex fine particles, and, if necessary, a phosphonic acid metal complex, for example, a phosphonic acid copper complex, in a matrix resin. As an additive for adjusting the absorption waveform, at least one kind of the near-infrared dye having an absorption maximum wavelength in a wavelength range of 650 to 800 nm may be added.

A coating liquid for forming a near-infrared absorbing film having the above configuration is applied onto a substrate by a spin coating or a wet coating method using a dispenser to form a near-infrared absorbing film. Thereafter, a predetermined heat treatment is performed on this coating film to cure the coating film to form a near-infrared absorbing film.

The matrix resin used for forming the near-infrared absorbing film is a resin which is transparent to visible light and near-infrared light and is capable of dispersing fine particles of a metal complex or a phosphonic acid copper complex. The metal complex or the phosphonic acid copper complex is a substance having a relatively low polarity and is well dispersed in a hydrophobic material. Therefore, as the matrix resin for forming the near-infrared absorbing film, a resin having an acrylic group, an epoxy group, or a phenyl group may be used. Among them, it is particularly preferable to use a resin having a phenyl group as a matrix resin of a near-infrared absorbing film. In this case, the matrix resin of the near-infrared absorbing film has high heat resistance. In addition, a polysiloxane silicone resin has advantageous characteristics as a material for an image sensor for a solid-state imaging element because it is difficult to thermally decompose, has high transparency to visible light and near-infrared light, and has high heat resistance. Therefore, it is also preferable to use a polysiloxane as a matrix resin of a near-infrared absorbing film. As a polysiloxane that may be used as a matrix resin for near-infrared absorbing films, it is available as a commercial product. Examples thereof include KR-255, KR-300, KR-2621-1, KR-211, KR-311, KR-216, KR-212 and KR-251, which are silicone resins manufactured by Shin-Etsu Chemical Co., Ltd.

Examples of the silicone resin include SS-6203, SS-6309, VS-9301, and VS-9506, all of which are silicone resins manufactured by Sanyu Rec Co., Ltd.

As the matrix resin used for forming the near-infrared absorbing film of the present invention, it is also preferable to contain a matrix resin having an epoxy group from the viewpoint of low gas permeability.

In this case, the matrix resin having an epoxy group constituting the near-infrared absorbing film exhibits high moisture resistance, and therefore has suitable properties as a material for an image sensor for a solid-state imaging element.

Specific examples of the resin having an epoxy group that may be used as a matrix resin for a near-infrared absorbing film include KJC-X5 (manufactured by Shin-Etsu Chemical Co., Ltd.), NLD-L-672 (manufactured by Sanyu Rec Co., Ltd.), and LE-1421 (manufactured by Sanyu Rec Co., Ltd.), and EpiFine series (manufactured by KISCO Ltd.).

Further, as the matrix resin of the near-infrared absorbing film, it is also preferable to use the resin having both the polysiloxane and the epoxy group mentioned above.

In this case, the matrix resin having both the polysiloxane and the epoxy group exhibits high heat resistance and moisture resistance, and therefore has suitable properties as a material for an image sensor for a solid-state imaging element.

Specific examples of the resin having both a polysiloxane and an epoxy group that can be used as a matrix resin for a near-infrared absorbing film include the EpiFine series (manufactured by KISCO Ltd.) and the ILLUMIKA series (manufactured by Kaneka Corporation).

The film thickness of the near-infrared absorbing film of the present invention is not particularly limited, but is preferably in the range of 200 m.

(Other Additives)

Other additives may be applied to the near-infrared absorbing film of the present invention within a range not impairing the object effect of the present invention. Examples thereof include a sensitizer, a crosslinking agent, a curing accelerator, a filler, a thermal curing accelerator, a thermal polymerization inhibitor, and a plasticizer. Further, an adhesion accelerator on the surface of the base material and other auxiliary agents (e.g., conductive particles, a filler, a defoaming agent, a flame retardant, a leveling agent, a release accelerator, an antioxidant, a perfume, a surface tension modifier, and a chain transfer agent) may be used in combination.

By appropriately incorporating these components, it is possible to adjust the desired properties such as stability and physical properties of the near-infrared absorbing film.

These components may be referred to the contents described in paragraphs 0183-0185 of JP-A 2012-003225, paragraphs 0101-0102 of JP-A 2008-250074, paragraphs 0103-0104 of JP-A 2008-250074, and paragraphs 0107-0109 of JP-A 2008-250074, for example.

Since the near-infrared absorbing composition of the present invention may be a wet coating liquid, a near-infrared absorbing film (for example, a near-infrared cut filter) may be easily manufactured by a simple process of forming a film by a spin coating.

<<Application to Image Sensor for Solid-State Imaging Element>>

The near-infrared absorbing film of the present invention is suitably applied to the following devices. Examples of the application are: a visibility correction member for CCD, CMOS, or other light receiving element, a photometric member, a heat ray absorbing member, a composite optical filter, a lens member (eyeglasses, sunglasses, goggles, optical system, and optical waveguide system), a fiber member (optical fiber), a noise cut member, a display cover or a display filter such as a plasma display front plate, a projector front plate, a light source heat ray cutting member, a color tone correcting member, an illumination brightness adjusting member, an optical element (optical amplifying element, wavelength conversion element), a Faraday element, an optical communication function device such as an isolator, an optical disk element.

The applications of the near-infrared absorbing film having a near-infrared absorbing composition of the present invention are suitable, in particular, for a near-infrared cut filter on the light-receiving side of the solid-state imaging element substrate (for example, for near-infrared cut filter for a wafer-level lens), and for a near-infrared cut filter on the back side of the solid-state imaging element substrate (the side opposite to the light-receiving side). It is characterized in that it is applied to the image sensor for a solid-state imaging element.

By applying the near-infrared absorbing film of the present invention to an image sensor for a solid-state imaging element, it is possible to improve the visible portion transmittance, the near-infrared light absorbing efficiency, and the heat and humidity resistance.

Specifically, the near-infrared absorbing film (near-infrared cut filter) of the present invention is provided on an image sensor for a solid-state imaging element.

The FIGURE is a schematic cross-sectional view showing a configuration of a camera module including a solid-state imaging element including an infrared cut filter which is a near-infrared absorbing film of the present invention.

The camera module 1 shown in the FIGURE is connected to a circuit board 12 which is a mounting board via solder balls 11 which are a connecting member.

More specifically, the camera module 1 is configured with composing a solid-state imaging element substrate 10 having an imaging element section 13 on a first main surface of a silicon substrate, a flattening layer 8 provided on a first main surface side (light receiving side) of the solid-state imaging element substrate 10, a near-infrared cut filter (near-infrared absorbing film) 9 provided on the flattening layer 8, a glass substrate 3 (light transmitting substrate) disposed above the near-infrared cut filter 9, a lens holder 5 arranged above the glass substrate 3 and having an image pickup lens 4 in the inner space thereof, a light and electromagnetic shield 6 arranged so as to surround the solid-state imaging element substrate 10 and the glass substrate 3. Each member is adhered by adhesives 2 and 7.

The present invention is a method of manufacturing a camera module having a solid-state imaging element substrate and an infrared cut filter disposed on a light-receiving side of the solid-state imaging element substrate, and it is possible to form a near-infrared absorbing film by spin-coating the infrared absorbing liquid composition of the present invention on the light-receiving side of the solid-state imaging element substrate.

Therefore, in the camera module 1, for example, a near-infrared absorbing film is formed by spin-coating the near-infrared absorbing composition of the present invention on the flattening layer 8 to form the infrared cut filter 9.

In the camera module 1, the incident light L from the outside is sequentially transmitted through the imaging lens 4, the glass substrate 3, the infrared cut filter 9, and the flattening layer 8, and then reaches the imaging element section of the solid-state imaging element substrate 10.

Further, the camera module 1 is connected to the circuit board 12 via the solder balls 11 (connecting material) on the second main surface side of the solid-state imaging element substrate 10.

EXAMPLES

Hereinafter, the present invention will be specifically described by way of examples, but the present invention is not limited thereto. In the examples, "parts" or "%" is used, but unless otherwise specified, it indicates "parts by mass"

or "% by mass". Each operation was performed at room temperature (25° C.) unless otherwise specified.

Example 1

<<Preparation of Near-Infrared Absorbing Composition>>
(Preparation of Near-Infrared Absorbing Composition 1)

1.463 g of copper (II) acetate monohydrate (manufactured by Kanto Chemical Co., Inc., hereinafter simply referred to as "copper acetate") and 60 g of tetrahydrofuran (THF) were mixed and stirred for 1 hour to prepare a copper acetate solution.

Next, to the obtained copper acetate solution was added a solution containing 0.477 g of exemplary compound 78, which is a compound A, as one of the two types of phosphoric acid ester compounds having a structure represented by Formula (II), 0.607 g of exemplary compound 80, which is other compound B, and 5 g of THF. The mixture was stirred for 30 minutes to prepare a solution A.

Next, 5 g of THF was added to 0.613 g of ethylphosphonic acid (manufactured by Tokyo Chemical Industry Co., Ltd.), which is a compound having a structure represented by Formula (I), and the mixture was stirred for 30 minutes to prepare a solution B.

Then, the solution B was added to the solution A while stirring the solution A, and then the mixture was stirred at room temperature for 16 hours to prepare a solution C.

The solution C and 25 g of toluene were placed in a flask, and while heating in an oil bath (manufactured by Tokyo Rika Kikai Co., Ltd., model: OSB-2100) at 50 to 100° C., a rotary evaporator (manufactured by Tokyo Rika Kikai Co., Ltd., model: model: N-1000) was used to remove the solvent for 30 minutes.

Then, the amount of the solvent was adjusted so that the solid content concentration of the solution C in the flask was 10% by mass, and this was designated as a near-infrared absorbing composition 1.

The molar ratio of phosphonic acid to the total amount of the phosphoric acid ester compound in the near-infrared absorbing composition 1 is 2.81.

(Preparation of Near-Infrared Absorbing Compositions 2 to 36)

In the above-described near-infrared absorbing composition 1, near-infrared absorbing compositions 2 to 36 were prepared in the same manner, except that the type (change in the type of alkyl group) and the added amount (mol number) of phosphonic acid compound represented by Formula (I), the type, the addition amount ratio, and the total addition amount (mol number) of the phosphoric acid ester compound or the sulfonic acid ester compound represented by Formula (II) (Compound 1 and Compound 2 shown in Table V and Table VI), and the ratio (mol ratio) of the phosphonic acid compound to the amount of the phosphoric acid ester compound or the sulfonic acid ester compound added were changed to the configurations shown in Table V and Table VI.

The configurations of the near-infrared absorbing compositions 1 to 36 prepared as described above are shown in Tables V and VI below.

TABLE V

| Infrared absorbing composition number | Phosphonic acid compound of Formula (I) | | Phosphoric acid ester compound or sulfonic acid ester compound | | | | Phosphonic acid/*1 (mol ratio) | Remarks |
|---|---|---|---|---|---|---|---|---|
| | | | Compound 1 | | Compound 2 | | | |
| | Phosphonic acid type | Phosphonic acid [mol] | Added amount [mol] | Type | Addition amount ratio | Type | Addition amount ratio | | |
| 1 | Ethylphosphonic acid | 0.76 | 0.27 | Exemplary compound 78 | 0.50 | Exemplary compound 80 | 0.50 | 2.81 | Present Invention |
| 2 | Ethylphosphonic acid | 0.74 | 0.29 | Exemplary compound 78 | 0.50 | Exemplary compound 80 | 0.50 | 2.55 | Present Invention |
| 3 | Ethylphosphonic acid | 0.76 | 0.27 | Exemplary compound 61 | 0.70 | Exemplary compound 80 | 0.30 | 2.81 | Present Invention |
| 4 | Ethylphosphonic acid | 0.74 | 0.38 | Exemplary compound 61 | 0.70 | Exemplary compound 80 | 0.30 | 1.95 | Present Invention |
| 5 | Hexylphosphonic acid | 0.76 | 0.27 | Exemplary compound 78 | 0.80 | Exemplary compound 80 | 0.20 | 2.81 | Present Invention |
| 6 | Octylphosphonic acid | 0.76 | 0.27 | Exemplary compound 79 | 0.25 | Exemplary compound 80 | 0.75 | 2.81 | Present Invention |
| 7 | Ethylphosphonic acid | 0.76 | 0.27 | Exemplary compound 61 | 0.50 | Exemplary compound 80 | 0.50 | 2.81 | Present Invention |
| 8 | Ethylphosphonic acid | 0.74 | 0.29 | Exemplary compound 61 | 0.50 | Exemplary compound 80 | 0.50 | 2.55 | Present Invention |
| 9 | Ethylphosphonic acid | 0.77 | 0.26 | Exemplary compound 61 | 0.50 | Exemplary compound 80 | 0.50 | 2.96 | Present Invention |
| 10 | Ethylphosphonic acid | 0.76 | 0.27 | Exemplary compound 14 | 0.50 | Exemplary compound 28 | 0.50 | 2.81 | Present Invention |
| 11 | Ethylphosphonic acid | 0.76 | 0.27 | Exemplary compound 15 | 0.50 | Exemplary compound 13 | 0.50 | 2.81 | Present Invention |
| 12 | Hexylphosphonic acid | 0.76 | 0.27 | Exemplary compound 61 | 0.50 | Exemplary compound 79 | 0.50 | 2.81 | Present Invention |
| 13 | Hexylphosphonic acid | 0.74 | 0.29 | Exemplary compound 61 | 0.50 | Exemplary compound 79 | 0.50 | 2.55 | Present Invention |
| 14 | Octylphosphonic acid | 0.76 | 0.27 | Exemplary compound 61 | 0.50 | Exemplary compound 79 | 0.50 | 2.81 | Present Invention |
| 15 | Ethylphosphonic acid | 0.76 | 0.27 | Exemplary compound 61 | 0.50 | Exemplary compound 79 | 0.50 | 2.81 | Present Invention |
| 16 | Ethylphosphonic acid | 0.76 | 0.27 | Exemplary compound 29 | 0.50 | Exemplary compound 32 | 0.50 | 2.81 | Present Invention |
| 17 | Hexylphosphonic acid | 0.76 | 0.27 | Exemplary compound 5 | 0.50 | Exemplary compound 29 | 0.50 | 2.81 | Present Invention |

TABLE V-continued

| Infrared absorbing composition number | Phosphonic acid compound of Formula (I) | | | Phosphoric acid ester compound or sulfonic acid ester compound | | | | Phosphonic acid/*1 (mol ratio) | Remarks |
|---|---|---|---|---|---|---|---|---|---|
| | Phosphonic acid type | Phosphonic acid [mol] | Added amount [mol] | Compound 1 | | Compound 2 | | | |
| | | | | Type | Addition amount ratio | Type | Addition amount ratio | | |
| 18 | Octylphosphonic acid | 0.74 | 0.29 | Exemplary compound 5 | 0.50 | Exemplary compound 29 | 0.50 | 2.55 | Present Invention |

*1: Phosphoric acid ester compound or sulfonic acid ester compound

TABLE VI

| Infrared absorbing compostion number | Phosphonic acid compound of Formula (1) | | | Phosphoric acid ester compound or sulfonic acid ester compound | | Phosphoric acid ester compound or sulfonic acid ester compound | | Phosphonic acid/*1 (mol ratio) | Remarks |
|---|---|---|---|---|---|---|---|---|---|
| | | | | Compound 1 | | Compound 2 | | | |
| | Phosphonic acid type | Phosphonic acid [mol] | Added amount [mol] | Type | Addition amount ratio | Type | Addition amount ratio | | |
| 19 | Ethylphosphonic acid | 0.76 | 0.27 | Exemplary compound 64 | 0.50 | Exemplary compound 23 | 0.50 | 2.81 | Present Invention |
| 20 | Ethylphosphonic acid | 0.74 | 0.38 | Exemplary compound 64 | 0.70 | Exemplary compound 23 | 0.30 | 1.95 | Present Invention |
| 21 | Ethylphosphonic acid | 0.80 | 0.22 | Exemplary compound 64 | 0.70 | Exemplary compound 23 | 0.30 | 3.64 | Present Invention |
| 22 | Ethylphosphonic acid | 0.74 | 0.29 | Exemplary compound 64 | 0.70 | Exemplary compound 23 | 0.30 | 2.55 | Present Invention |
| 23 | Ethylphosphonic acid | 0.77 | 0.26 | Exemplary compound 64 | 0.50 | Exemplary compound 23 | 0.50 | 2.96 | Present Invention |
| 24 | Ethylphosphonic acid | 0.76 | 0.27 | Exemplary compound 64 | 0.50 | Exemplary compound 9 | 0.50 | 2.81 | Present Invention |
| 25 | Ethylphosphonic acid | 0.76 | 0.27 | Exemplary compound 6 | 0.50 | Exemplary compound 61 | 0.50 | 2.81 | Present Invention |
| 26 | Ethylphosphonic acid | 0.76 | 0.27 | Exemplary compound 5 | 0.50 | Exemplary compound 23 | 0.50 | 2.81 | Present Invention |
| 27 | Propylphosphonic acid | 0.76 | 0.27 | Exemplary compound 5 | 0.50 | Exemplary compound 23 | 0.50 | 2.81 | Present Invention |
| 28 | Propylphosphonic acid | 0.76 | 0.27 | Exemplary compound 5 | 0.75 | Exemplary compound 23 | 0.25 | 2.81 | Present Invention |
| 29 | Propylphosphonic acid | 0.76 | 0.27 | Exemplary compound 5 | 0.50 | Exemplary compound 29 | 0.50 | 2.81 | Present Invention |
| 30 | Propylphosphonic acid | 0.76 | 0.27 | Exemplary compound 5 | 0.25 | Exemplary compound 29 | 0.75 | 2.81 | Present Invention |
| 31 | Propylphosphonic acid | 0.74 | 0.40 | Exemplary compound 5 | 0.50 | Exemplary compound 15 | 0.50 | 1.85 | Present Invention |
| 32 | Propylphosphonic acid | 0.74 | 0.29 | Exemplary compound 5 | 0.50 | Exemplary compound 15 | 0.50 | 2.55 | Present Invention |
| 33 | Propylphosphonic acid | 0.76 | 0.27 | Exemplary compound 5 | 0.50 | Exemplary compound 29 | 0.50 | 2.81 | Present Invention |
| 34 | Butylphosphonic acid | 0.76 | 0.27 | Exemplary compound 5 | 0.50 | Exemplary compound 29 | 0.50 | 2.81 | Present Invention |
| 35 | Ethylphosphonic acid | 0.87 | 0.43 | Exemplary compound 80 | 1.00 | — | — | 2.02 | Comparative Example |
| 36 | Butylphosphonic acid | 0.98 | 0.54 | Exemplary compound 61 | 1.00 | — | — | 1.81 | Comparative Example |

*1: Phosphoric acid ester compound or sulfonic acid ester compound

<<Evaluation of Near-Infrared Absorbing Composition>>

The following evaluations were carried out for each of the near-infrared absorbing compositions prepared above.

[Evaluation of Transmittance (Visible Part)]

The near-infrared absorbing compositions 1 to 36 prepared above were diluted with toluene so that the transmittance at the wavelength of 1100 nm was 5%, and a sample A for evaluation was prepared.

Next, for each evaluation sample A, the spectral transmittance in the wavelength range of 300 to 1200 nm was measured using a spectrophotometer V-570 manufactured by JASCO Corporation as a measuring device. Then, the transmittance at 500 nm as the visible part region was determined, and the transmittance (visible part) was evaluated according to the following criteria.

AA: The transmittance at 500 nm is 95% or more.
BB: The transmittance at 500 nm is 90% or more and less than 95%.
CC: The transmittance at 500 nm is 80% or more and less than 90%.
DD: Transmittance at 500 nm is less than 80%.

[Evaluation of Mass Absorbance]

The mass absorbance was measured according to the following method.

A measurement sample was prepared by diluting the near-infrared absorber with toluene so that the solid content concentration of the near-infrared absorber was 0.5% by mass. The absorbance of this measurement sample was measured at room temperature using a spectrophotometer U-3010 (manufactured by Hitachi, Ltd.) with a 1 cm quartz cell. The intensity of the peak top appearing in the range of 700 to 900 nm was measured, and the mass absorbance was determined according to the following equation.

Mass absorbance L/(g·cm)=(Absorbance of diluted solution)/(Solid content concentration (g/L)) The specific gravity of toluene was set to 0.867 g/mL for calculation.

The following ranking was performed based on the obtained mass absorbance.

AA: Mass absorbance is 0.30 L/(g·cm) or more.
BB: Mass absorbance is 0.25 L/(g·cm) or more and less than 0.30 L/(g·cm).
CC: Mass absorbance is 0.20 L/(g·cm) or more and less than 0.25 L/(g·cm).
DD: Mass absorbance is less than 0.20 L/(g·cm).

[Evaluation of Average Particle Size]

For each of the prepared near-infrared absorbing compositions, the average particle size of the near-infrared absorber was measured according to the following method.

Each of the above near-infrared absorbing compositions was diluted with toluene so that the particle concentration (solid content concentration) of the near-infrared absorber, which is a particle, was 1.0% by mass to prepare a sample for measurement.

Then, the average particle size of the measurement sample was measured by a dynamic light scattering method using the zeta potential/particle size measurement system ELSZ-1000ZS manufactured by Otsuka Electronics Co., Ltd. as a measuring device, and the average particle size was measured. The particle size was evaluated according to the following criteria.

The obtained average particle size data was ranked according to the following criteria.

AA: The average particle size is less than 60 nm.
BB: The average particle size is 60 nm or more and less than 100 nm.
CC: The average particle size is 100 nm or more and less than 200 nm.
DD: The average particle size is 200 nm or more.

[Evaluation of Film Thickness]

For the near-infrared absorbing compositions 1 to 36 of the present invention prepared above, a matrix resin having a polysiloxane structure was used as a binder resin, and a coating liquid for each near-infrared absorbing film was prepared to have a respective solid content ratio of 5:5.

Next, each coating liquid for forming a near-infrared absorbing film was applied onto a glass substrate under a thickness condition such that the transmittance at a wavelength of 880 nm was 1%, and cured. Then, it was dried on a hot plate by heating at 80° C. for 1 hour, and at 150° C. for 2 hours to form each near-infrared absorbing film.

Then, the film thickness of each near-infrared absorbing film was measured using a film thickness meter with the following combination.

(Terminal, Stand, Reader)
Terminal: DIGIMICRO MH-15M (manufactured by NIKON Corporation)
Stand: DIGIMICRO STAND MS-5C (manufactured by NIKON Corporation)
Reader: DIGITAL READ OUT TC-101A (manufactured by NIKON Corporation)

As a result of measuring the film thickness of the near-infrared absorbing films 1 to 36 according to the above method, all the near-infrared absorbing films 1 to 34 have a thickness of 200 μm or less. The thickness of the near-infrared absorbing film 35 was 230 μm, and the thickness of the near-infrared absorbing film 36 was 240 μm.

Table VII shows the evaluation results excluding the film thickness obtained as described above.

TABLE VII

| Near-infrared absorbing composition number | Transmittance (visible part) at 500 nm | Mass absorbance [L/g · cm] | Average particle size | Remarks |
|---|---|---|---|---|
| 1 | BB | BB | BB | Present Invention |
| 2 | BB | CC | BB | Present Invention |
| 3 | BB | BB | BB | Present Invention |
| 4 | BB | CC | BB | Present Invention |
| 5 | BB | CC | BB | Present Invention |
| 6 | BB | CC | BB | Present Invention |
| 7 | AA | BB | AA | Present Invention |
| 8 | AA | BB | AA | Present Invention |
| 9 | BB | BB | CC | Present Invention |
| 10 | BB | AA | BB | Present Invention |
| 11 | BB | AA | BB | Present Invention |
| 12 | AA | BB | AA | Present Invention |
| 13 | AA | BB | AA | Present Invention |
| 14 | AA | CC | AA | Present Invention |
| 15 | AA | BB | AA | Present Invention |
| 16 | BB | AA | BB | Present Invention |
| 17 | AA | BB | AA | Present Invention |
| 18 | BB | BB | BB | Present Invention |
| 19 | AA | AA | AA | Present Invention |
| 20 | BB | CC | AA | Present Invention |
| 21 | CC | BB | CC | Present Invention |
| 22 | AA | BB | AA | Present Invention |
| 23 | BB | AA | BB | Present Invention |
| 24 | BB | AA | BB | Present Invention |
| 25 | BB | AA | AA | Present Invention |
| 26 | BB | AA | AA | Present Invention |
| 27 | AA | AA | AA | Present Invention |
| 28 | AA | AA | AA | Present Invention |
| 29 | AA | AA | AA | Present Invention |
| 30 | AA | AA | AA | Present Invention |

TABLE VII-continued

| Near-infrared absorbing composition number | Evaluation result | | | Remarks |
|---|---|---|---|---|
| | Transmittance (visible part) at 500 nm | Mass absorbance [L/g · cm] | Average particle size | |
| 31 | BB | BB | AA | Present Invention |
| 32 | AA | AA | AA | Present Invention |
| 33 | AA | AA | AA | Present Invention |
| 34 | AA | AA | AA | Present Invention |
| 35 | CC | DD | CC | Comparative Example |
| 36 | CC | DD | CC | Comparative Example |

As is clear from the results listed in Table VII, the near-infrared absorbing composition of the present invention composed of a phosphonic acid compound defined in the present invention, a compound A and a compound B having a different molecular weight as two or more kinds of phosphoric acid ester compounds or sulfonic acid ester compounds having different molecular weight, and copper ions. The near-infrared absorbing composition of the present invention has high transmittance in the visible light region, high mass absorbance, and can reduce the average particle size of the near-infrared absorber compared to the comparative example. Further, the above-mentioned effect of the present invention is further exhibited in the configuration (near-infrared absorbing compositions 12 to 34) using two kinds of compounds A in which the total number of l and m (l+m) in Formula (II) is less than 4. It was found that it is a preferable embodiment.

INDUSTRIAL APPLICABILITY

The near-infrared absorbing film of the present invention is suitably applied to the following devices. Examples of the application are: a visibility correction member for CCD, CMOS, or other light receiving element, a photometric member, a heat ray absorbing member, a composite optical filter, a lens member (eyeglasses, sunglasses, goggles, optical system, and optical waveguide system), a fiber member (optical fiber), a noise cut member, a display cover or a display filter such as a plasma display front plate, a projector front plate, a light source heat ray cutting member, a color tone correcting member, an illumination brightness adjusting member, an optical element (optical amplifying element, wavelength conversion element), a Faraday element, an optical communication function device such as an isolator, an optical disk element. The applications of the near-infrared absorbing film having a near-infrared absorbing composition of the present invention are suitable, in particular, for a near-infrared cut filter on the light-receiving side of the solid-state imaging element substrate (for example, for near-infrared cut filter for a wafer-level lens), and for a near-infrared cut filter on the back side of the solid-state imaging element substrate (the side opposite to the light-receiving side). It is suitably applied to the image sensor for a solid-state imaging element.

DESCRIPTION OF SYMBOLS

1: Camera Module
2, 7: Adhesive
3: Glass substrate
4: Imaging lens
5: Lens holder
6: Light and electromagnetic shield
8: Flattening layer
9: Near-infrared absorbing film (Near-infrared cut filter)
10: Solid-state imaging element substrate
11: Solder ball
12: Circuit board
13: Imaging element section

What is claimed is:

1. A near-infrared absorbing composition comprising a near-infrared absorber and a solvent, wherein the near-infrared absorber contains at least one of the following component (A) or component (B), Component (A): a component composed of a phosphonic acid compound represented by the following Formula (I), two or more kinds of phosphoric acid ester compounds or sulfonic acid ester compounds having different structures, and copper ions; and Component (B): a component composed of a copper complex obtained by a reaction of a phosphonic acid compound represented by the following Formula (I), two or more kinds of phosphoric acid ester compounds or sulfonic acid ester compounds having different structures, and a copper compound,

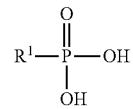

Formula (I)

in Formula (I), $R^1$ represents a hydrogen atom, an alkyl group having 1 to 20 carbon atoms, or a fluorinated alkyl group having 1 to 20 carbon atoms, and the two or more kinds of phosphoric acid ester compounds or sulfonic acid ester compounds having different structures in the component (A) and the component (B) are:

two or more kinds of phosphoric acid monoester compounds and two or more kinds of phosphoric acid diester compounds; or one kind of phosphoric acid monoester compound, one kind of phosphoric acid diester compound, and one kind of sulfonic acid ester compound.

2. A near-infrared absorbing composition comprising a near-infrared absorber and a solvent, wherein the near-infrared absorber contains at least one of the following component (A) or component (B), Component (A): a component composed of a phosphonic acid compound represented by the following Formula (I), two or more kinds of phosphoric acid ester compounds or sulfonic acid ester compounds having different structures, and copper ions; and Component (B): a component composed of a copper complex obtained by a reaction of a phosphonic acid compound represented by the following Formula (I), two or more kinds of phosphoric acid ester compounds or sulfonic acid ester compounds having different structures, and a copper compound,

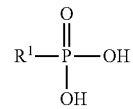

Formula (I)

in Formula (I), $R^1$ represents a hydrogen atom, an alkyl group having 1 to 20 carbon atoms, or a fluorinated alkyl group having 1 to 20 carbon atoms, and wherein the two or more kinds of phosphoric acid ester compounds or sulfonic acid ester compounds having different structures in the component (A) and the component (B) contain a compound A and a compound B, wherein the compound A has a structure represented by the following Formula (II), and is selected from the phosphoric acid ester compound or the sulfonic acid ester compound in which l and m each are respectively 0 or more, and the total number of l and m (l+m) is 1 or more and less than 4, and the compound B has a structure represented by the following Formula (II), and is selected from the phosphoric acid ester compound or the sulfonic acid ester compound in which l and m each are respectively 0 or more, and the total number of l and m (l+m) is in the range of 4 to 10, Formula (II)

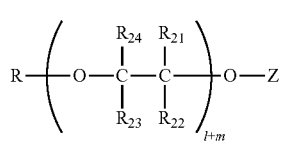

in the above Formula (II), R represents an alkyl group having 1 to 20 carbon atoms or an aryl group having 6 to 20 carbon atoms, R may further have a substituent, and Z represents a structural unit selected from Formulas (Z-1) to (Z-3) below,

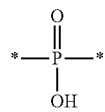

(Z-1)

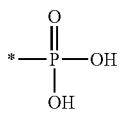

(Z-2)

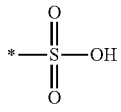

(Z-3)

an asterisk (*) described in the above Formulas (Z-1) to (Z-3) represents a binding site and binds 0 in the above Formula (II), $R_{21}$ to $R_{24}$ each respectively represent a hydrogen atom or an alkyl group having 1 to 4 carbon atoms, provided that the compound having a structure represented by Formula (II) has at least one partial structure satisfying the following condition (i) or one partial structure satisfying the condition (ii), or has at least both of one partial structure satisfying the following condition (i) and one partial structure satisfying the condition (ii), Condition (i): $R_{21}$ to $R_{24}$ all represent a hydrogen atom; and Condition (ii): at least one of $R_{21}$ to $R_{24}$ represents an alkyl group having 1 to 4 carbon atoms, in Formula (II), l represents a number of partial structures satisfying the above condition (i), m represents a number of partial structures satisfying the above condition (ii), l and m in the compound A each are respectively 0 or more, the total number of l and m (l+m) is 1 or more and less than 4, l and m in the compound B each are respectively 0 or more, and the total number of l and m (l+m) is in the range of 4 to 10.

3. The near-infrared absorbing composition described in claim 1, wherein a content of the phosphonic acid is 2.5 times or more on a molar basis with respect to the total content of the phosphoric acid ester compound or the sulfonic acid ester compound.

4. The near-infrared absorbing composition described in claim 2, wherein a ratio of the compound A to the total mass of the phosphoric acid ester compound and the sulfonic acid ester compound is 50% by mass or more.

5. The near-infrared absorbing composition described in claim 1, wherein the two or more kinds of phosphoric acid ester compounds or sulfonic acid ester compounds having different structures in the component (A) and the component (B) are at least two compounds selected from the phosphoric acid ester compound or the sulfonic acid ester compound having a structure represented by the following Formula (II), Formula (II)

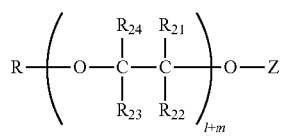

in the above Formula (II), R represents an alkyl group having 1 to 20 carbon atoms or an aryl group having 6 to 20 carbon atoms, R may further have a substituent, and Z represents a structural unit selected from Formulas (Z-1) to (Z-3) below,

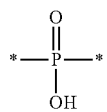

(Z-1)

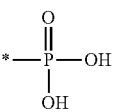

(Z-2)

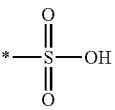 [SMILES: *S(=O)(=O)O]

(Z-3)

an asterisk (*) described in the above Formulas (Z-1) to (Z-3) represents a binding site and binds O in the above Formula (II), $R_{21}$ to $R_{24}$ each respectively represent a hydrogen atom or an alkyl group having 1 to 4 carbon atoms, provided that the compound having a structure represented by Formula (II) has at least one partial structure satisfying the following condition (i) or one partial structure satisfying the condition (ii), or has at least both of one partial structure satisfying the following condition (i) and one partial structure satisfying the condition (ii), Condition (i): $R_{21}$ to $R_{24}$ all represent a hydrogen atom; and Condition (ii): at least one of $R_{21}$ to $R_{24}$ represents an alkyl group having 1 to 4 carbon atoms, in Formula (II), 1 represents a number of partial structures satisfying the above condition (i), m represents a number of partial structures satisfying the above condition (ii), and 1 and m each are respectively a number of 0 or more, and the total number of 1 and m (1+m) is 1 or more and less than 4.

6. The near-infrared absorbing composition described in claim 1, wherein in at least one compound among the two or more compounds having a structure represented by Formula (II), 1 and m each are respectively 1 or more.

7. The near-infrared absorbing composition described in claim 1, having a mass absorbance of 0.30 L/(g·cm) or more.

8. The near-infrared absorbing composition described in claim 1, wherein an average particle size of the near-infrared absorber is 100 nm or less.

9. The near-infrared absorbing composition described in claim 1, containing a near-infrared absorption modifier having an absorption maximum wavelength in the wavelength range of 650 to 1000 nm.

10. A near-infrared absorbing film using the near-infrared absorbing composition described in claim 1.

11. An image sensor for a solid-state imaging element provided with the near-infrared absorbing film described in claim 10.

\* \* \* \* \*